United States Patent [19]

Maruyama et al.

[11] Patent Number: 6,034,894
[45] Date of Patent: Mar. 7, 2000

[54] NONVOLATILE SEMICONDUCTOR STORAGE DEVICE HAVING BURIED ELECTRODE WITHIN SHALLOW TRENCH

[75] Inventors: Tohru Maruyama, Yokohama; Riichiro Shirota, Fujisawa, both of Japan

[73] Assignee: Kabushiki Kaisha Toshiba, Kawasaki, Japan

[21] Appl. No.: 09/090,625

[22] Filed: Jun. 4, 1998

[30] Foreign Application Priority Data

Jun. 6, 1997 [JP] Japan .................................. 9-149681
Apr. 23, 1998 [JP] Japan ................................. 10-113413

[51] Int. Cl.[7] ................................................. G11C 16/04
[52] U.S. Cl. ................................ 365/185.17; 365/185.03; 257/288; 257/316
[58] Field of Search ........................ 365/185.17, 185.03; 257/316, 288

[56] References Cited

U.S. PATENT DOCUMENTS 4,979,004  12/1990  Esquivel et al. ......................... 257/316
5,698,879  12/1997  Aritome et al. ......................... 257/315
5,781,478   7/1998  Takeuchi et al. ...................... 365/185.11
5,869,858   2/1999  Ozawa et al. ............................ 257/296

OTHER PUBLICATIONS

J.D. Choi, et al., "A Novel Booster Plate Technology in High Density NAND Flash Memories for Voltage Scaling–Down and Zero Program Disturbance," *Symposium on VSLI Technology Digest of Technical Papers.* pp. 238–239.

*Primary Examiner*—David Nelms
*Assistant Examiner*—Hoai V. Ho
*Attorney, Agent, or Firm*—Loeb & Loeb

[57] ABSTRACT

In a NAND cell type of EEPROM memory which has an STI (Shallow Trench Isolation) structure and uses memory cells into which two- or more-value data can be rewritten through the use of floating channel writing techniques, a plurality of floating gate electrodes are formed above the surface of an Si substrate with a tunnel oxide interposed therebetween. Trenches are formed in portions of the surface of the Si substrate each of which is located between floating gate electrodes arranged in one direction. In each trench, a conductive material is buried to form a buried electrode which is externally impressed with a low voltage. This boots the channel potential of nonselected cells, preventing erroneous writing without increasing the cost per bit.

20 Claims, 20 Drawing Sheets

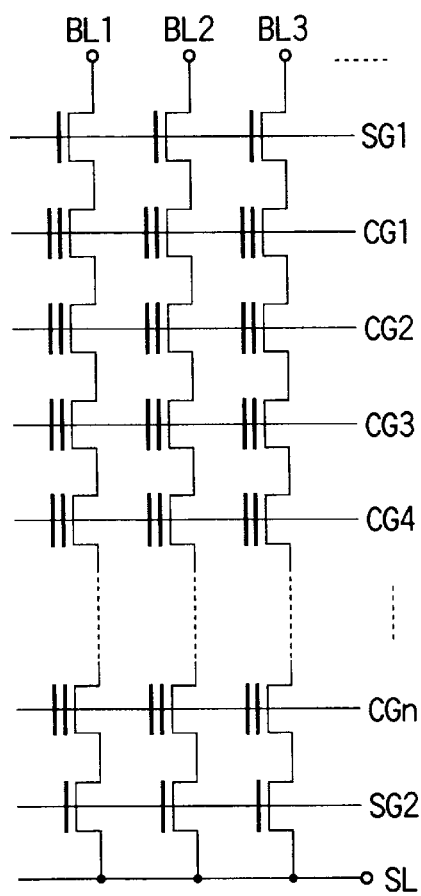
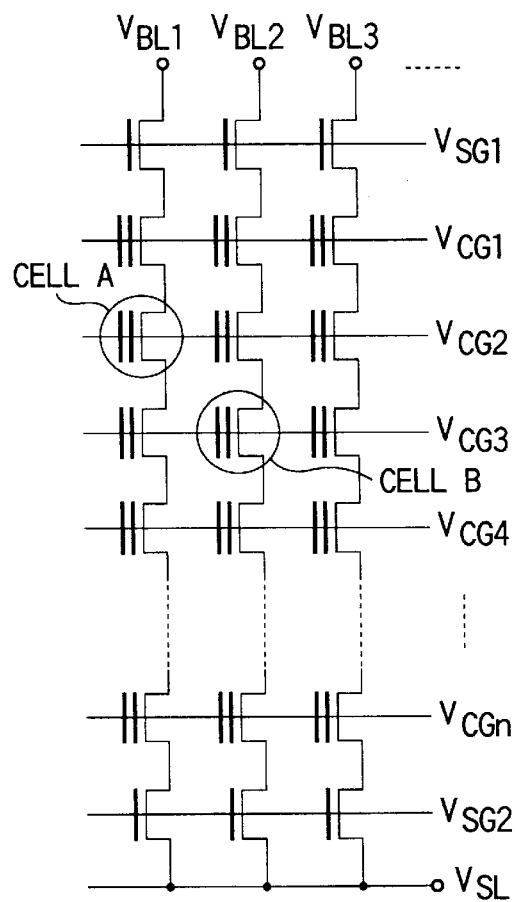
FIG. 1
PRIOR ART
FIG. 2
PRIOR ART

NOTE: APPLICATION TIMING OF VOLTAGE TO BURIED ELECTRODE 18 IS THE SAME AS APPLICATION TIMING OF VOLTAGE Vpass IN THE CASE OF TABLES 4 AND 5

NONVOLATILE SEMICONDUCTOR STORAGE DEVICE HAVING BURIED ELECTRODE WITHIN SHALLOW TRENCH

BACKGROUND OF THE INVENTION

The present invention relates to a nonvolatile semiconductor storage device. More particularly, the present invention relates to a NAND cell type of EEPROM (Electrically Erasable Programmable Read Only Memory) which has an STI (Shallow Trench Isolation) structure and uses memory cells which permit two or more valued data to be electrically rewritten into through the use of techniques of writing into the floating channel.

Conventionally, as a nonvolatile semiconductor storage device which is electrically rewritable and allows a high packing density, a NAND cell type of EEPROM is known in which a plurality of memory cells are connected in series. In this semiconductor storage device, each of the memory cells has a stacked gate structure in which a floating gate and a control gate are stacked with an insulating film interposed therebetween. In addition, the memory cells are connected in series in such a way that adjacent cells share a source/drain diffused region. The memory cells that are connected in series forms a unit. The memory cells as a unit are connected to a bit line (data line), forming a NAND type cell (hereinafter referred to as a NAND cell). The NAND cells are arranged in a matrix to form a memory cell array.

That is, each of NAND cells arranged in each column in the memory cell array has a drain diffused region at its one end connected to a bit line through a select gate and a source diffused region at its other end connected to a common source line (reference potential supply line) through a select gate. The control gates of memory cells arranged in a row are connected in common to a control gate line (word line) and the control electrodes of select gates arranged in the row direction are connected in common to and a select gate line.

If, in the NAND cell type of EEPROM, lower voltage operation were realized, a column decoder connected to the bit lines could be formed from Vcc-operated transistors. This would help reduce the area of peripheral circuitry and the chip size.

From this point of view, in recent years, a floating channel writing method has been proposed and put to practical use. The floating channel writing method is described as follows.

FIG. 1 shows an equivalent circuit of the memory cell section of a NAND cell type of EEPROM. In this figure, BL (BL1, BL2, BL3, . . . ) denotes a bit line, SG (SG1, SG2) denotes a select gate, CG (CG1 to CGn) denotes a word line, and SL denotes a source line.

In normal data write operations, the cells are written into in the order of arrangement beginning with the cell that is the farthest from the corresponding bit line BL. In random writing, on the other hand, the cells between the bit line BL and the source line SL are written into in a random order. First, 0 volts are applied to the select gates on the source line SL side to turn their associated transistors off. In this state, 0 volts are applied to a bit line BL associated with a NAND cell containing a memory cell into which a 0 is to be written. To a bit line associated with a NAND cell containing a memory cell into which a 1 is to be written is applied a voltage which is larger than or equal to the select gate voltage on the drain diffused region side. In this manner, a selection between writing and nonwriting is made for each bit line. Alternatively, by applying to the bit line a potential which, even if it is lower than the select gate voltage on the drain diffused region side, permits the select gate SG to turn off, a selection between writing and nonwriting is made for each bit line.

That is, in this state, a potential that permits memory cells to turn on is applied to all the word lines CG in a selected block (when a write voltage Vpp or a nonselected word-line voltage Vpass is applied, memory cells are brought to the on state at a certain potential when the voltage pulse is increasing to a maximum). Then, 0 volts are transferred to the channel of a NAND cell connected to a bit line for writing a 0. On the other hand, to the channel of a NAND cell connected to a bit line for writing a 1 a certain initial potential (the potential on that bit line minus the threshold of the select gate) is transferred from that bit line through the select gate SG on the bit line side. Thus, the NAND cell connected to the bit line for writing a 1 become floating. At this point, 0 volts or a certain positive potential is applied to the source line SL to turn off the select gate on the source diffused region side.

Next, the write voltage Vpp is applied to a selected word line associated with the memory cell into which a 0 is to be written. As a consequence, a 0 will be written into the selected memory cell that is connected to the selected bit line supplied with 0 volts. At this point, it is required that the channel potential of nonselected memory cells which are associated with the selected word line but are not to be written with a 0 (memory cells in which their associated select gates SG on the bit line side are turned off and hence their channels are in the floating state) be sufficiently large so that a 0 will not be written into (so that variations in threshold will fall within an allowable range). In the case of these memory cells, as the difference between the write voltage Vpp and the channel potential Vch becomes smaller, variations in threshold become smaller. For this reason, a certain voltage Vpass is applied to nonselected word lines which are not associated with a memory cell into which a 0 is to be written. By so doing, the channel potential of the memory cells is increased from an initial potential to a certain potential by capacitive coupling of their floating channels with the nonselected and selected word lines. In this case, the greater the voltage Vpass, the smaller the variations in threshold become.

Of memory cells connected with the selected bit line supplied with 0 volts, memory cells into which a 0 is not to be written are also supplied with the voltage vpass. In this case, the greater the voltage Vpass, the easier the variations in threshold become to occur.

Thus, the minimum and maximum values of the voltage Vpass are determined taking these conditions into consideration. In order to reduce the variations in the threshold of memory cells into which a 0 is to be written and errors associated with writing, a step-up method is normally employed in which the voltages Vpass and Vpp are each optimized for their initial voltage, step voltage, final voltage, and pulse width.

Data erase includes batch erase by which all the memory cells of a NAND cell are simultaneously erased and block erase in byte units. In the case of batch erase, all the control gates (or all the control gates in a selected block) are set to 0 volts and all the selected gates SG are supplied with the voltage Vpp or placed in the floating state. The bit lines and the source line SL are made floating and P-well regions are impressed with a high voltage of, for example, 20 volts. Thereby, in all the memory cells (or all the memory cells in a selected block), electrons are forced from the floating gate into the P-well region, shifting the threshold in the negative direction. In the case of block erase, it is required that the control gates in a nonselected block be impressed with a high voltage of, for example, 20 volts or maintained floating.

For data reading, a read voltage (for example, 4.5 volts) is applied to the select gates SG1 and SG2 and the word lines CG associated with nonselected memory cells other than a selected memory cell, thereby turning the nonselected memory cells on. On the other hand, 0 volts are applied to the word line associated with the selected memory cell. By sensing a current flowing through the bit line, discrimination between a 0 and a 1 can be made.

Such a NAND cell type EEPROM writing method (floating channel writing method) conventionally used suffers from the problems described below.

FIG. 2 shows an equivalent circuit of a NAND cell type of EEPROM to describe the memory cell operation at the time of writing into the floating channel. Here, a write-selected memory cell A and a nonselected memory cell B are illustrated by way of example. With the write selected memory cell A into which a 1 is to be written, its channel is maintained floating and its associated word line CG is impressed with the voltage Vpp. With the nonselected memory cell B, its associated bit line BL is impressed with 0 volts and its associated word line CG is impressed with the voltage Vpass. $V_{BL}$ ($V_{BL1}$, $V_{BL2}$, $V_{BL3}$ ...) denotes a voltage applied to a bit line BL, $V_{SG}$ ($V_{SG1}$, $V_{SG2}$) denotes a voltage applied to a select gate SG, $V_{CG}$ ($V_{CG1}$ to $V_{CGn}$) denotes a voltage applied to a word line CG, and $V_{SL}$ denotes a voltage applied to the source line SL. Although, in this example, the second memory cell counting from the bit line side is made the selected memory cell A, an arbitrary memory cell is selected during normal writing operation.

FIG. 3 shows voltage waveforms applied to the respective electrodes to describe the operation of the circuit shown in FIG. 2. First, the bit line BL1 is impressed with either 0 volts or supply voltage Vcc (for example, 3.3 volts), depending on data to be written into, the source line SL and the select gate SG1 on the bit line side are impressed with the supply voltage (3.3 volts), and the select gate SG2 on the source diffused region side is impressed with 0 volts. In this state, the channel of the NAND cell associated with the bit line BL1 into which a 0 is not written becomes floating. After that, the selected word line CG2 is impressed with voltage Vpp and the nonselected word lines CG1, CG3 to CGn are impressed with voltage Vpass, booting the floating channel to a certain potential Vch. The channel potential Vch and the potentials of the respective electrodes are related by $$Vch = V_{SG} - V_{SG}th(Vchinit) +$$
$$Cr1(Vpass - Vpassth(Vch)) +$$
$$Cr2(Vpp - Vpassth(Vch))$$

where $V_{SG}th(Vchinit)$ is the threshold of the select gate SG1 on the drain diffused region side when the channel potential is Vchinit, Cr1 is the boot ratio of the channel (the ratio between the capacitance associated with the memory cell impressed with voltage Vpp and the capacitance associated with the depletion layer extending below the channel due to voltage Vpp), and Vpassth(Vch) is a potential required to turn on the memory cell impressed with voltage Vpass when the channel potential is Vch.

In this case, however, a decrease in the initial voltage, Vchinit, transferred from the bit line to the channel region and a decrease in channel boot efficiency (Cr1, Cr2) due to an increase in the capacitance associated with the depletion layer below the channel and the capacitance between the 0-V terminal and the channel are liable to occur. This is due to various conditions for forming memory cells and select gates, such as impurity profiles of the select gates, the memory cells and a semiconductor substrate in which the select gates and the memory cells are formed (the impurity concentration of boron when these are formed in a P well region), the concentration of impurities introduced into the select gates and the memory cells by means of ion implantation, the impurity profiles of drain/source diffused regions of the select gates and memory cells, etc. As a result, a sufficient channel potential cannot be obtained and the threshold of a memory cell into which a 1 is written varies, which may result in a write error.

FIG. 4 shows a plot of the thresholds of the cells A and B against the voltage Vpass when such a write error occur. As can been seen from this figure, the threshold of the cell A (the memory cell into which a 1 is to be written) shifts in the positive direction (Vpass stress) when the magnitude of voltage Vpass decreases. On the other hand, the threshold of the cell B varies (Vpp stress) when the magnitude of voltage Vpass increases greatly.

The variation in threshold tends to become noticeable when there are great variations in writing characteristics, which are due to variations in the gate width, gate length, wing width, tunnel oxide thickness, interlayer polysilicon insulating film thickness of memory cells, etc. In particular, the threshold variation becomes easier to occur as the number of bits in a selected block becomes larger at the time of writing. Moreover, when leak current between the floating channel and the well region, between the source/drain region and the well region, or between adjacent bit lines is great, the threshold variation becomes still greater. Furthermore, variations in the characteristics of each select gate transistor adapted to transfer the potential on the bit line to the channel also greatly affect the threshold variations.

As described above, it is known that the memory cell and select gate transistor characteristics affect the writing characteristics as shown in FIG. 4. Improved storage devices are taught in a paper entitled "A Novel BOOSTER Plate Technology in High Density NAND Flash Memories for Voltage Scaling-Down and Zero Program Disturbance" by J. D. Choi et al, IEEE Symposium on VLSI Technology Digest of Technical Papers, 1996, pp. 238-. Also, a paper entitled "Process Integration for the High Speed NAND Flash Memory Cell" by D. J. Kim et al appears on pages 236- of the same journal.

The problems with the methods described in these papers are that processing steps become complicated, the number of processing steps increases, the chip size increases, and so on. In addition, the presence of variations in threshold greatly affect the data holding characteristics of memory cells when they are read from or in the idle state, lowering reliability.

That is, a conventional measure taken against erroneous writing is to form a booster polysilicon layer on each control gate as described in the first mentioned paper and to apply a high positive voltage of the order of 9 to 17 volts to that layer, thereby booting the channel potential of write-nonselected memory cells and improving the coupling characteristic of cells. In this manner, an improvement in write speed and compatibility with multi-valued memories can be achieved.

According to the above-described method, the degradation of the erroneous writing characteristic can be prevented, but an increase in the chip area occupied by a charge-pump circuit and row/column decoders is inevitable. An increase in the chip size will result in an increase in cost per bit.

BRIEF SUMMARY OF THE INVENTION

As described above, the conventional method, while preventing the deterioration of the writing characteristic, has a problem that the cost per bit increases due to an increase in the chip size.

It is therefore an object of the present invention to provide a nonvolatile semiconductor storage device which permits the deterioration of the writing characteristics to be prevented and the write speed to be improved.

According to an aspect of the present invention, there is provided a nonvolatile semiconductor memory device comprising: a semiconductor substrate having a major surface; a buried electrode formed by burying a conductive material in a plurality of trenches formed in the major surface of the semiconductor substrate with an insulating material interposed therebetween; a plurality of floating gate electrodes formed above other portions of the semiconductor substrate than the portions where the buried electrode is formed with a tunnel insulating film interposed therebetween, the transfer of charges being made between the floating gate electrodes and the semiconductor substrate through the tunnel insulating film; and a control gate electrode formed above the floating gate electrodes with an inter-gate insulating film interposed therebetween.

According to another aspect of the present invention, there is provided a nonvolatile semiconductor memory device comprising: a semiconductor substrate having a major surface; a plurality of floating gate electrodes formed above the surface of the semiconductor substrate with a tunnel insulating film interposed therebetween, the transfer of charges being made between the floating gate electrodes and the semiconductor substrate through the tunnel insulating film; a plurality of buried electrodes each formed by burying a conductive material in a corresponding respective one of a plurality of trenches formed in the major surface of the semiconductor substrate each of which is located between the floating gate electrodes; and a control gate electrode formed above the buried electrodes and the floating gate electrodes with an inter-gate insulating film interposed therebetween.

According to still another aspect of the present invention, there is provided a nonvolatile semiconductor memory device comprising: a semiconductor substrate having a major surface; a plurality of buried insulating films formed by burying an insulating material in a corresponding respective one of a plurality of trenches formed in selected portions of the major surface of the semiconductor substrate; a plurality of floating gate electrodes formed above portions of the major surface of the semiconductor substrate each of which is located between the buried insulating films with a tunnel insulating film interposed therebetween, the transfer of charges being made between the floating gate electrodes and the semiconductor substrate through the tunnel insulating film; a plurality of control gate electrodes each of which is formed above the floating gate electrode and arranged substantially perpendicular to the trenches with an inter-gate insulating film interposed therebetween; and a buried electrode formed in portions of the trenches each of which is located between the control gate electrodes, the buried electrode being buried in the portions of the trenches above the insulating material.

According to the nonvolatile semiconductor memory device of the present invention, the channel potential of a memory cell nonselected for write can be booted sufficiently by applying a low voltage to the buried electrode buried in each trench. This allows the suppression of variations in threshold of a memory cell which is connected to a selected word line and into which a 1 is to be written without increasing the chip size.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows a schematic equivalent circuit of the memory cell section of a conventional NAND cell type of EEPROM;

FIG. 2 is a diagram for use in explanation of the operation of cell in the circuit of FIG. 1;

DETAILED DESCRIPTION OF THE INVENTION

First Embodiment

Figure 5:
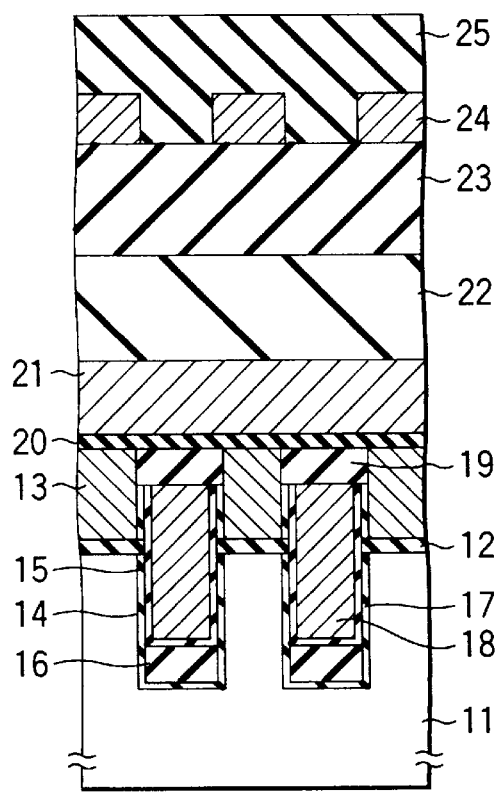
FIG. 5 is a sectional view of the cell section of a NAND cell type of EEPROM according to a first embodiment of the invention.

Referring now to FIG. 5, there is illustrated, in sectional view, the structure of the cell section of a NAND cell type of EEPROM according to a first embodiment of the present invention, which is of the STI (Shallow Trench Isolation) structure and the floating channel writing type. A tunnel oxide 12 is formed over the surface of an Si substrate 11 (a well region of a second conductivity formed in either a semiconductor substrate of a first conductivity type or a well region of the first conductivity type formed in a semiconductor substrate of the second conductivity type). A plurality of floating gate electrodes (floating gates) 13, serving as charge storage layers, are selectively formed on the tunnel oxide 12. Trenches 14 are formed in portions of the major surface of the Si substrate 11 each of which locates between the floating electrodes 13. In each trench, a CVD-SiO₂ film 16 is formed at its bottom with a sidewall oxide 15 interposed therebetween. On the top of the CVD-SiO₂ film 16 in each trench is formed an buried (sidewall poly) electrode 18 by burying a conductive material (3 poly). In this case, the sidewall oxide 15, the sidewall CVD-SiO₂ film 17 and the buried electrode 18 are formed so that their top protrudes from the surface of the Si substrate 11 (with 1 poly sidewall).

The sidewall 15, the sidewall CVD-SiO₂ film 17 and the buried electrode 18 are formed on top with a CVD-SiO₂ film 19. The CVD-SiO₂ films 19 and the floating gate electrodes 13 are formed on top with an ONO film (interlayer insulating film) 20 consisting of a multilayered structure of silicon oxide, silicon nitride and silicon oxide. A control gate electrode (2 poly) 21 is formed on the ONO film 20. On the control gate electrode 21 are formed a masking silicon nitride (SiN) film 22, an interlayer insulating film 23, and Al interconnects 21 in sequence. The entire surface is then covered with a passivation film 25.

Though not shown, source/drain diffusions are selectively formed in surface areas of the Si substrate 11. Each floating gate electrode 13 is located above the substrate region between the source/drain regions. Cells are connected in series in such a way that adjacent cells share a source/drain region, thus forming a NAND cell. Such NAND cells are arranged in a matrix form to form a memory cell array.

With such NAND cells of the STI structure and the floating channel writing type, a write voltage is applied to the floating gate electrode 21 and a low voltage is applied to the buried electrode 18. Controlling the cell channel potential in this manner allows the transfer of charges between the floating gate electrode 13 and the Si substrate 11 to thereby rewrite two- or four-valued data.

Figure 3:
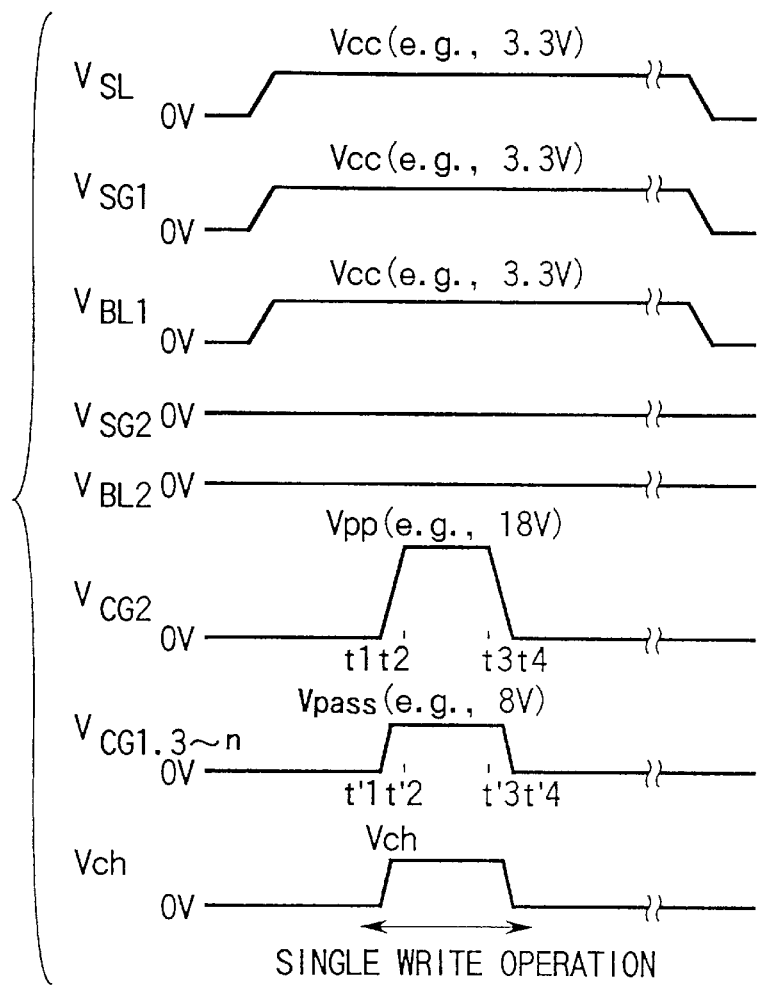
FIG. 3 is a timing diagram for use in explanation of the operation of cells in the circuit of FIG. 1.
Figure 4:
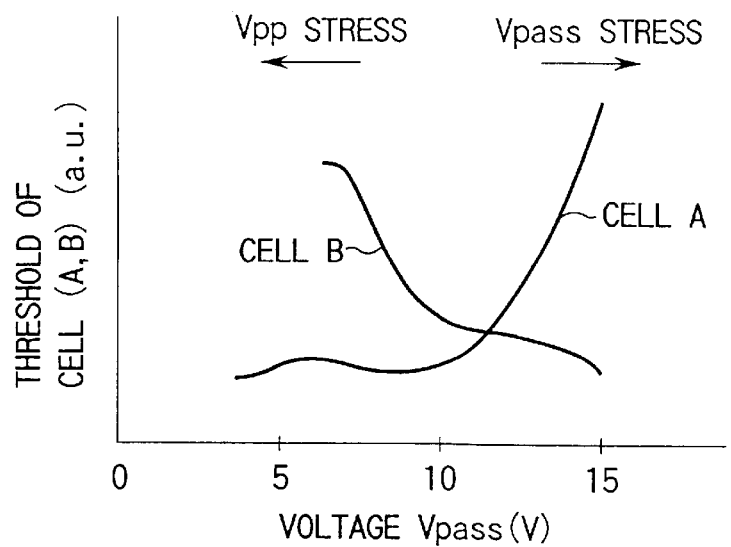
FIG. 4 shows a relationship between voltage Vpass and threshold values of the cells A and B shown in FIG. 2 when a write error occurs.
Figure 6A:
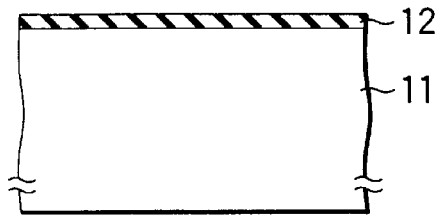
FIGS. 6A to 6J are sectional views, in the order of steps of manufacture, of the EEPROM memory shown in FIG. 5.

Reference will be next made to FIGS. 6A through 6J to describe a method of manufacturing the EEPROM memory constructed as described above. First, a tunnel oxide 12 for cell transistors, peripheral transistors, and select gate transistors is deposited over the Si substrate 11 as shown in FIG. 6A.

Figure 6B:
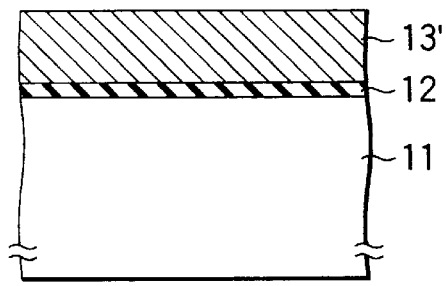

Next, as shown in FIG. 6B, a 1 poly layer 13' is deposited at a thickness of, for example, about 2,000 angstroms over the tunnel oxide 12 to form floating gate electrodes 13 later.

Figure 6C:
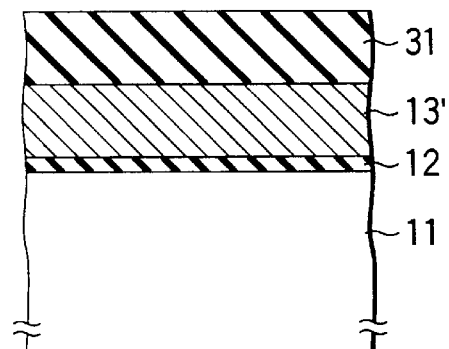

Next, as shown in FIG. 6C, a CVD-SiO₂ film 31, serving as a trench forming mask, is deposited at a thickness of, for example, about 3,000 angstroms over the 1 poly layer 13'.

Figure 6D:
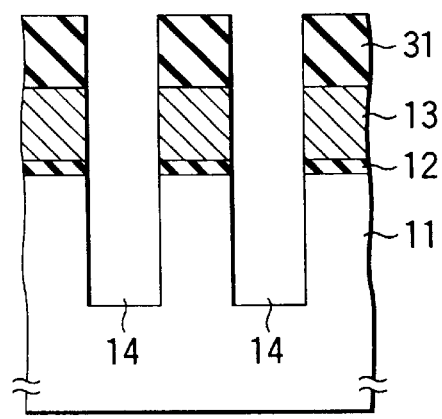

Next, the CVD-SiO₂ film 31 is patterned. Subsequent to the patterning process, using the CVD-SiO₂ film as a mask, floating gate electrodes 13 are formed by means of reactive ion etching techniques. As the same time, trenches 14 of a desired depth of, for example, 0.4 μm from the surface of the Si substrate 11 are formed as shown in FIG. 6D.

Figure 6E:
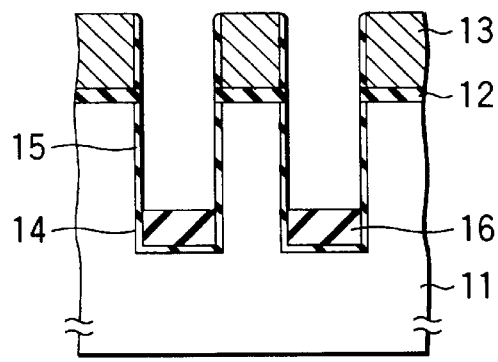

Next, a sidewall oxide 15 of a thickness of, for example, about 100 angstroms is formed by means of thermal oxidation. After the removable of the CVD-SiO₂ film 31, a CVD-SiO₂ film to be buried is deposited over the entire surface. The CVD-SiO₂ film is then etched back to leave it only at the bottom of the trenches 14 as shown in FIG. 6E.

Figure 6F:
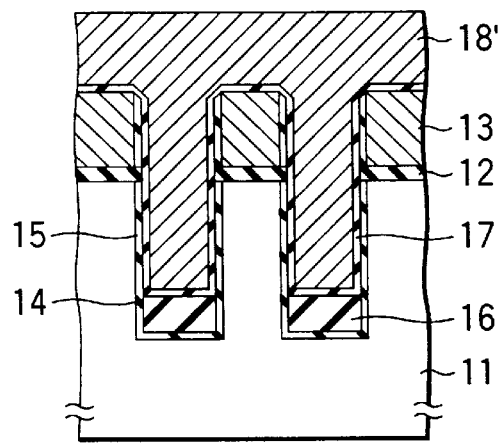

Next, a sidewall CVD-SiO₂ film 17 is deposited at a thickness of, for example, about 50 angstroms, which is employed to protect the floating gate electrodes 13. After that, a polycrystalline silicon layer (conductive material), or polysilicon layer 18' is deposited at a thickness of, for example, about 2,000 angstroms to thereby fill in the trenches 14 as shown in FIG. 6F.

Figure 6G:
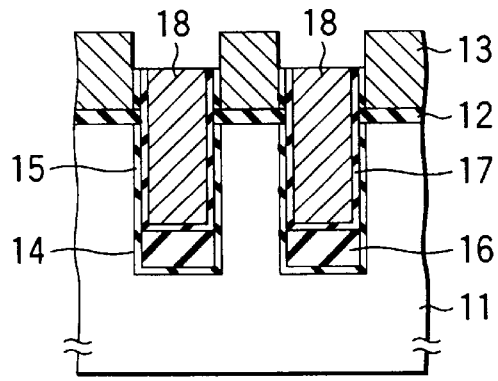

Next, the polysilicon layer 18' is etched back by high-selectivity RIE (Reactive Ion Etching) techniques to form the buried electrodes 18 and expose the top of each floating gate electrode 13. The sidewall oxide 15 and the sidewall CVD-SiO₂ film 17 which cover the sidewall of each floating gate electrode 13 are etched away using a ammonium fluoride liquid as shown in FIG. 6G. At this point, the etchback of the polysilicon layer 18' is stopped in the middle of the sidewall of each floating gate electrode 13 to allow the top of each buried electrode 18 to protrude from the surface of the Si substrate 11.

Figure 6H:
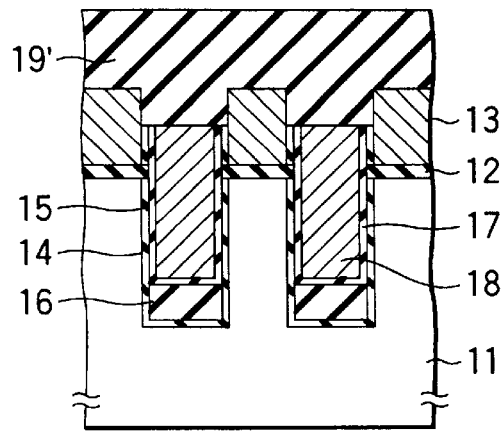

Next, a CVD-SiO$_2$ film 19' is deposited over the entire surface at a thickness of, for example, about 2,000 angstroms as shown in FIG. 6H.

Figure 6I:
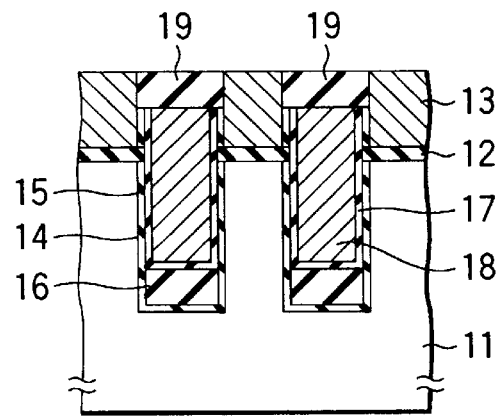

Next, the CVD-SiO$_2$ film 19' is etched back by means of high-resistivity RIE techniques until the top of each floating gate electrode 13 is exposed, so that the CVD-SiO$_2$ film 19 is formed as shown in FIG. 6I.

Figure 6J:
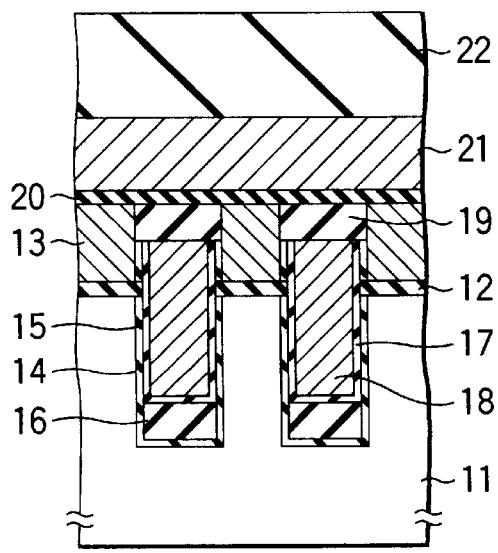

Next, an ONO film 20 is formed over the entire surface. A 2 poly layer, serving as a control gate electrode 21, is then deposited at a thickness of, for example, about 2,000 angstroms. An SiN film 22, used as a mask, is further deposited at a thickness of, for example, about 3,000 angstroms as shown in FIG. 6J.

Figure 10:
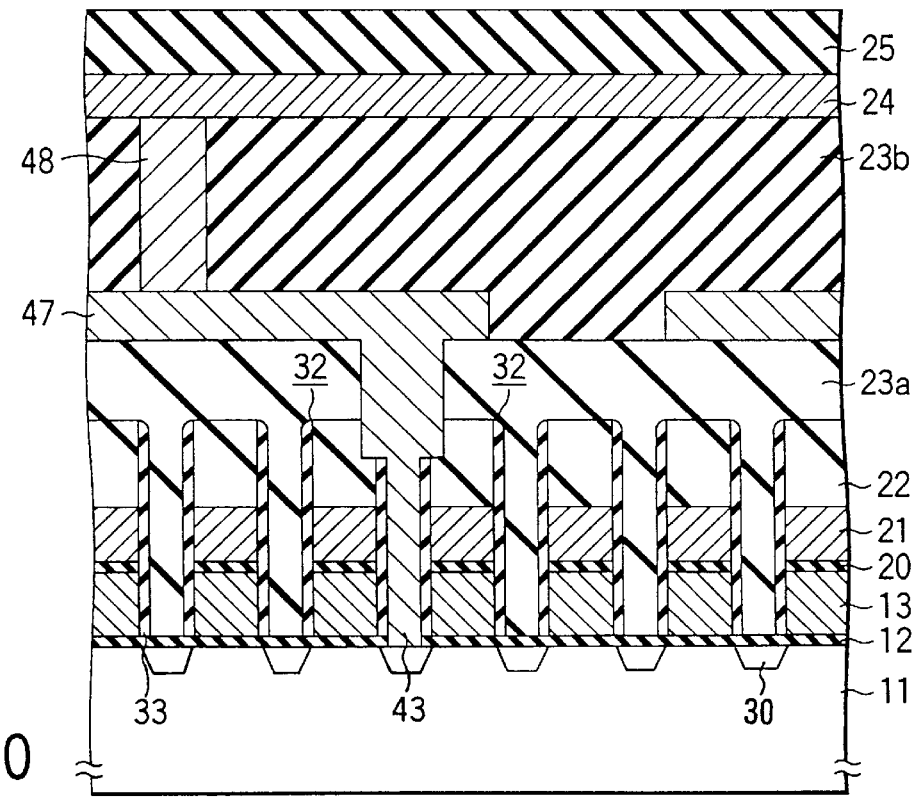
FIG. 10 is a sectional view taken along line X—X of FIG. 7.

Using the SiN film as a mask, the control gate electrode 21 is subjected to self-aligned etching to form gate electrode portions (see FIG. 10). Further, impurities are ion-implanted, forming a diffusion layer 30 (FIG. 10). Then a sidewall SiN film 33 for SAC (Self-Aligned Contact) is deposited at a thickness of, for example, about 500 angstroms and then an interlayer insulating film 23 (23a) is deposited. After the formation of self-aligned contacts, an interlayer insulating film 23 (23b) is deposited. After that, contact interconnects 48 and Al interconnects 24 are formed and a passivation film 25 is then formed, whereby the EEPROM cell section constructed as shown in FIG. 5 is completed.

Though not shown, the drain diffusion at one end of the NAND cell is connected through one or more select gates (SG) with a bit line extending in the column direction. The source diffusion at the other end of the NAND cell is connected through one or more select gates with a source line shared by one or more NAND cells. Further, the control gate electrode 21 is associated with all the cells arranged in a row to form a word line.

Figure 7:
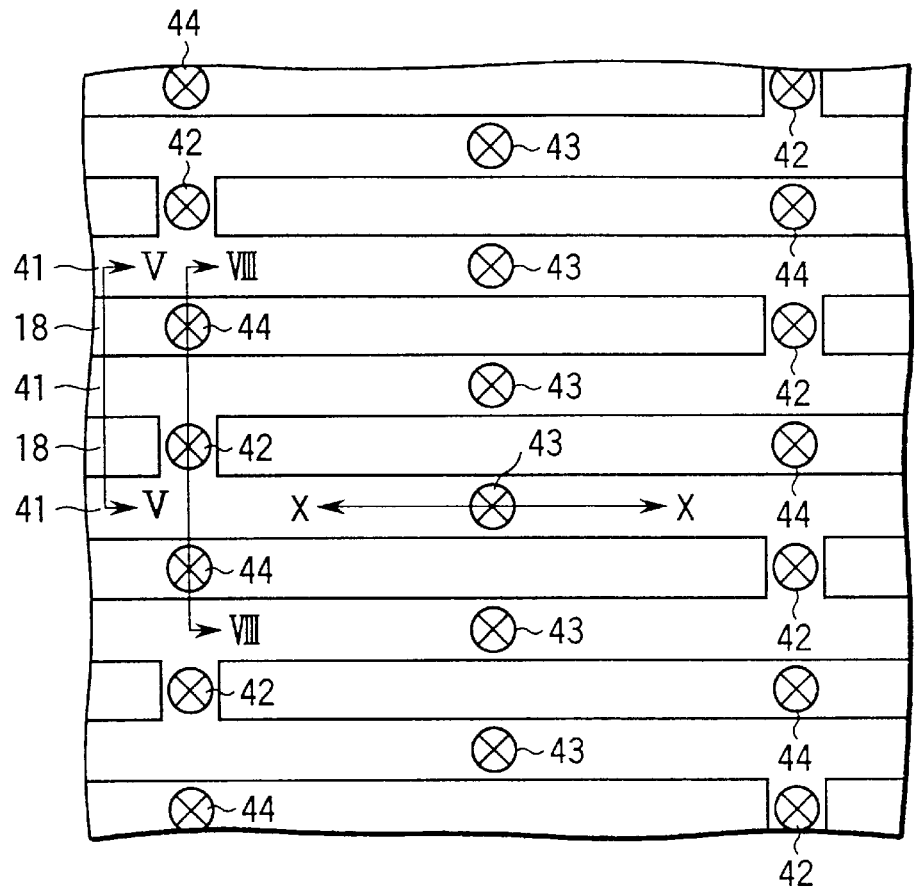
FIG. 7 is a plan view illustrating a layout of contact wirings in the cell section of the EEPROM memory shown n FIG. 5.

FIG. 7 shows a layout of contact wirings in the cell section of the EEPROM memory according to the above-described process. The section taken along line V—V of FIG. 7 substantially corresponds to FIG. 5.

Figure 8:
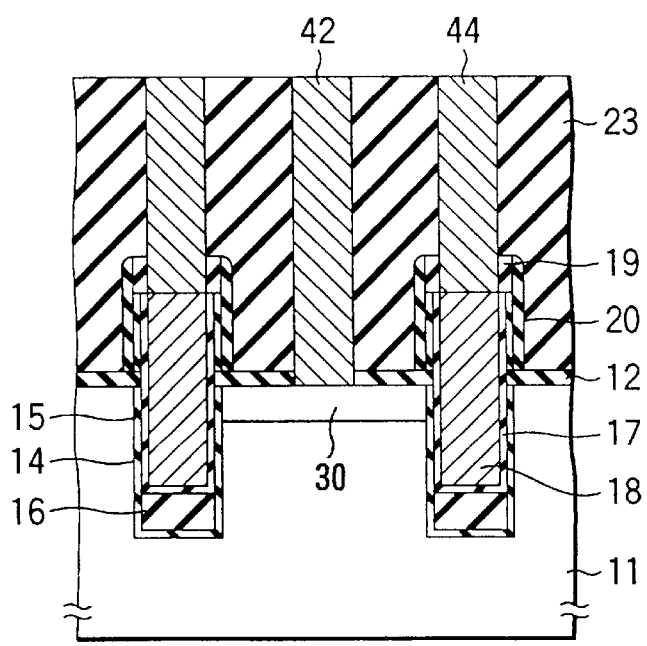
FIG. 8 is a sectional view taken along line VIII—VIII of FIG. 7.

As shown, of buried electrodes 18 each of which is placed between cell regions (active regions) 41, ones that are adjacent to each other in the row direction are offset from each other. Thereby, each of bit line contacts 42 can be provided for two NAND cells which are adjacent to each other in the row direction. Source line contacts 43 are placed so that each contact is shared by two NAND cells which are adjacent to each other in the column direction. Sidewall poly contacts 44 are placed alternately with the bit line contacts 42 in the row direction in the same position with respect to the column direction, as shown in FIG. 8 which is a sectional view taken along line VIII—VIII of FIG. 7. Such a pattern layout allows easing of contact pitch.

Here, in order to allow writing into or reading from either of two NAND cells which are adjacent to each other in the row direction and share a bit line contact 42, each NAND cell is connected to a bit line and a source line through two or more select gates having different thresholds.

Figure 9:
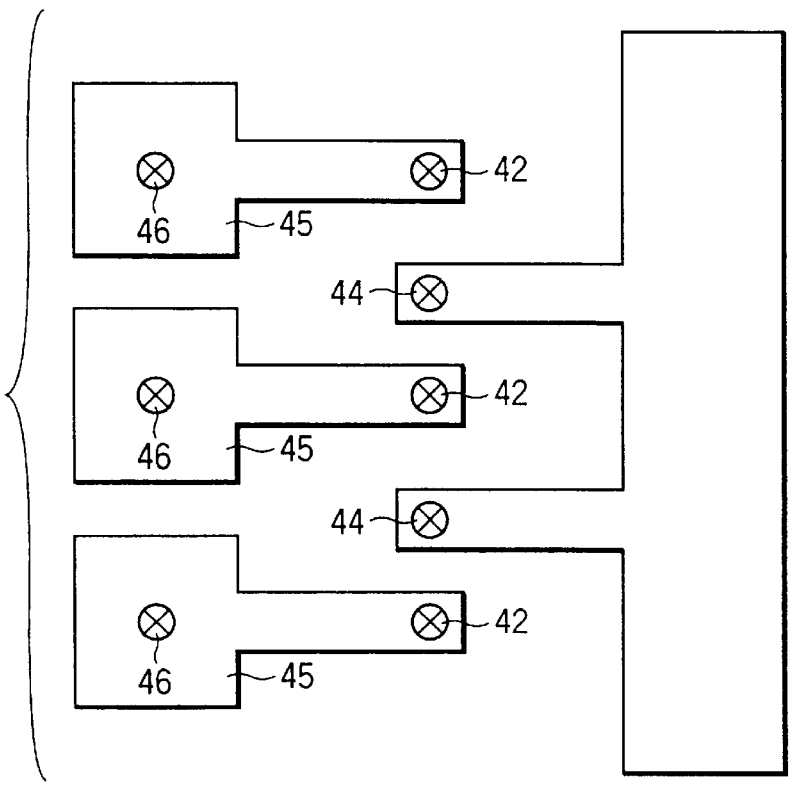
FIG. 9 is a plan view illustrating a way of pulling the contact wirings up to Al interconnects in the cell section of the EEPROM memory of the present invention.

FIG. 9 illustrates a method of implementing interconnection of a contact wiring and an Al wiring 24. When the bit line contacts 42 and the sidewall poly contacts 44 are placed alternately, the Al wiring 24 cannot be directly dropped to the bit line contact 42. In such a case, a lead 45 made of polysilicon is used which pulls out the bit line contact 42 aside to provide contact 46 with the Al wiring 24.

FIG. 10 shows the sectional structure of the cell section which substantially corresponds to a sectional view taken along line X—X of FIG. 7. The source line contact 43 is brought into contact with the Al wiring 24.

Figure 11:
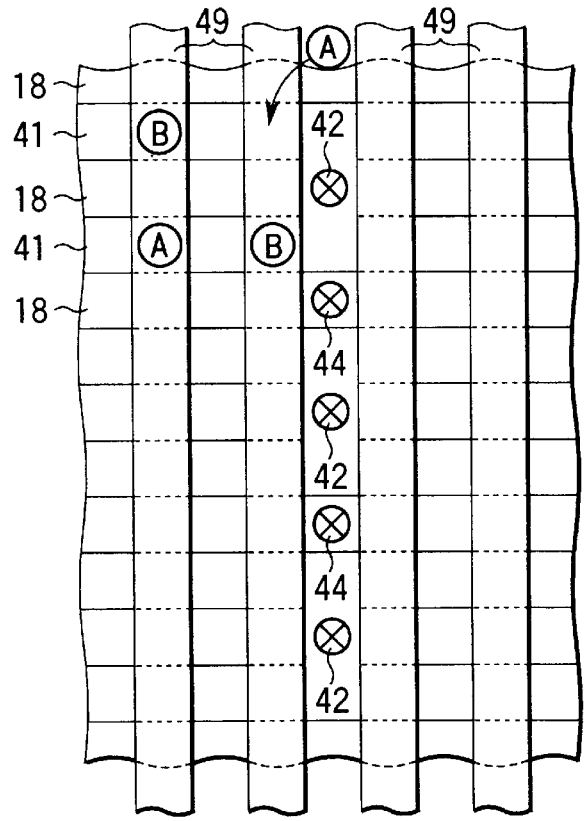
FIG. 11 is a plan view illustrating a layout of select gate transistors in the cell section of the EEPROM memory of the present invention.

FIG. 11 shows a layout of select gate transistors for taking one bit line contact 42 for every two NAND columns. In order to take one bit line contact 42 for two NAND cells, it is required to construct each select gate from two types of transistors: E-type transistor and D-type transistor. That is, to meet this requirement, ion implantation has only to be performed properly so that a select transistor (A) and a select transistor (B) will become E-type and D-type, respectively. Thereby, the select gate 49 is allowed to have transistors of E-type and D-type. Therefore, application of 0 volts or supply voltage Vcc to the select gate 49 will allow either of two NAND cells adjacent to each other in the row direction to be selected.

Hereinafter, a method of application of voltages to cells will be described.

Figure 12A:
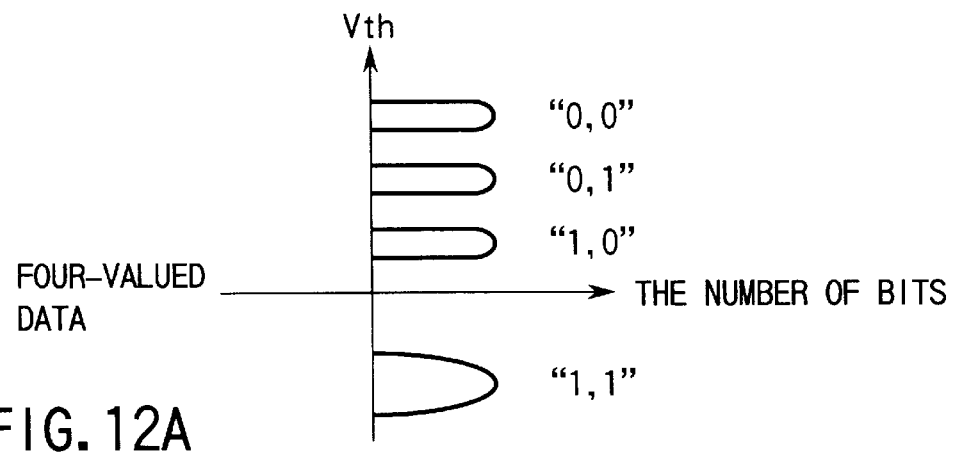
FIGS. 12A and 12B illustrate the distribution of thresholds of memory cells against the number of bits at the time of writing in of four-valued data and two-valued data, respectively.
Figure 12B:
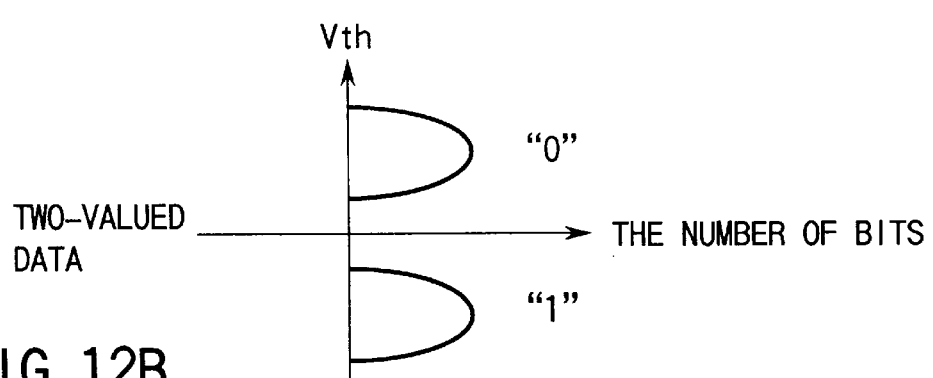
Figure 13:
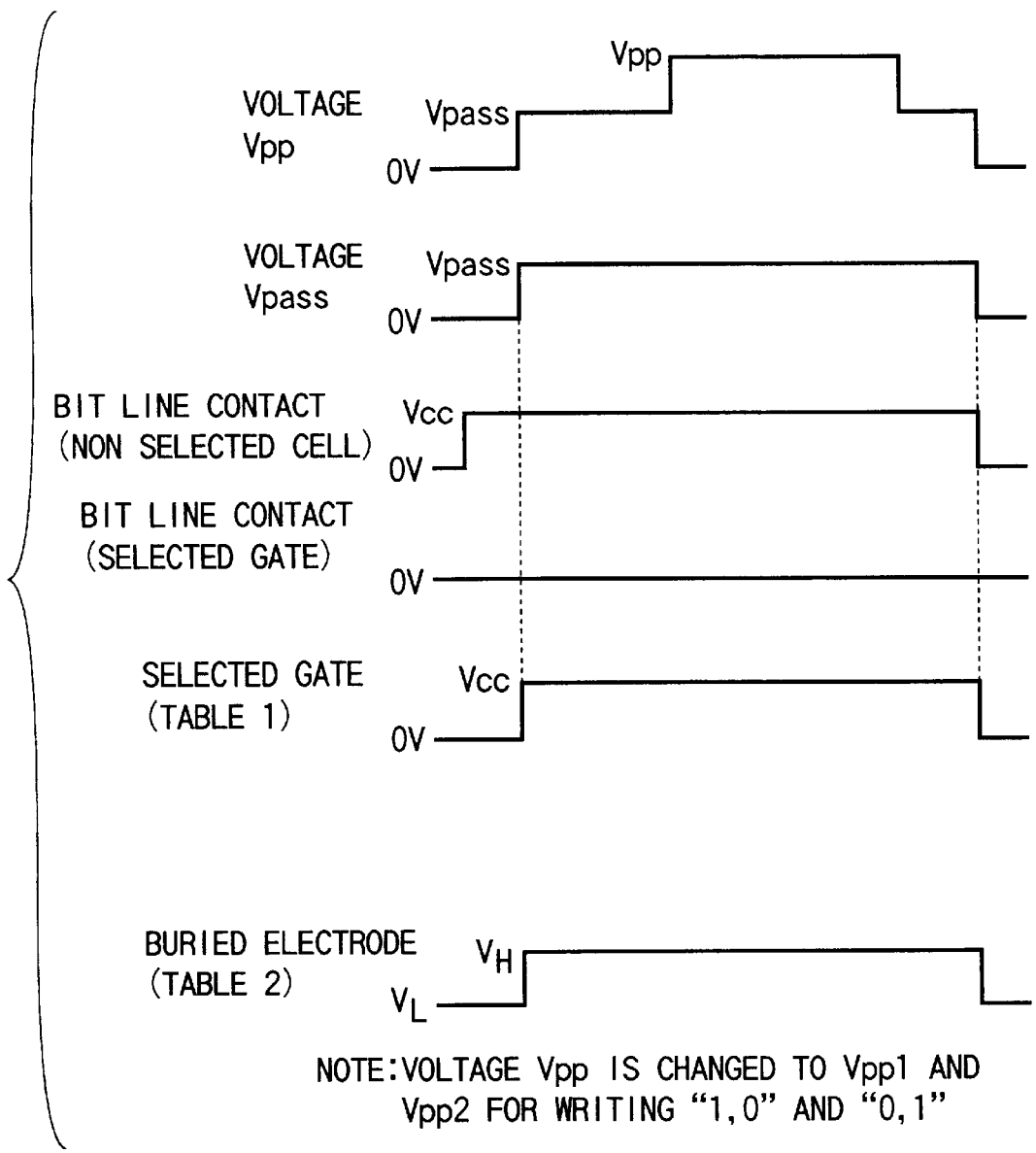
FIG. 13 is a timing diagram illustrating the timing of application voltages to main electrodes at the time of writing of data.

FIGS. 12A and 12B show the cell threshold distribution against the number of bits when four-valued data and two-valued data are written into. As shown in FIG. 12A, when the threshold Vth is divided into four, four-valued data, "0, 0", "0, 1", "1, 0" and "1, 1", can be written into. On the other hand, when the threshold Vth is divided into two as shown in FIG. 12B, two-valued data, "0" and "1", can be written into. FIG. 13 shows the timing of application of voltages to main electrodes at programming (data writing) time. Note that the voltages are desired voltages and the voltage application timing (the timing of application of the voltage Vpp, in particular) is desired timing. The voltages of the cell section at other times than the programming time remain unchanged from conventional devices and hence their descriptions are omitted here.

At data write time, in writing two-valued data (see Table 1), a voltage $V_H$ at a high level H (for example, 3 to 20 volts) is applied to the buried electrode 18 for both the selected and nonselected cells. That is, for the nonselected cells, the voltage $V_H$ is applied to the buried electrode 18 to raise the channel potential, thereby preventing erroneous writing. For the write-selected cell, on the other hand, the ground potential has been transferred from the bit line contact 42 to its channel. When the buried electrode 18 is not formed to reach the middle of the sidewall of the floating gate electrode (1 poly) 13 (without 1 poly sidewall), the voltage at the buried electrode 18 is independent of writing (see FIG. 14). In some cases, however, the adjacent bit line may be nonselected, that is, it may be supplied with supply voltage Vcc. For this reason, the high-level voltage $V_H$ is applied to the buried electrode. In the case as well where the buried electrode is formed to reach the middle of the sidewall of the floating gate electrode (with 1 poly sidewall), the high-level voltage $V_H$ is applied to the buried electrode. In this case, since the floating gate electrode is raised by the voltage at the buried electrode, an improvement in write speed can be expected.

TABLE 1

| Two-valued data (buried type with and without 1 poly sidewall) | | | | | |
|---|---|---|---|---|---|
| | Bit. Con | Selected gate | Nonselected gate | Sidewall poly | Write mode |
| Selected cell | Ground | Vpp | Vpass | H, H | "1"→"0" |
| Nonselected cell | Vcc | Vpp | Vpass | H, H | "1"→"1" |

H: $V_H$ (3 to 10 V)
L: $V_L$ (Ground)

With four-valued data writing, writing is performed in two separate write operations. Prior to data writing, all the cells are placed in the initial state of "1, 1". In the first operation, the ground potential is applied to the bit line contact 42 associated with a cell which is to be written to the "0, 0" state. The other bit line contacts are supplied with the high-level voltage $V_H$. Since the buried electrode is formed to reach the middle of the sidewall of the floating gate electrode, the write characteristic is improved as in the case of the two-valued data writing. In the second operation, supply voltage Vcc (nonselection) is applied to the bit line contacts associated with the cell in the "0, 0" state and the cell in the "1, 1" state. At the same time, the bit line contacts associated with the cell in the "0, 1" state and the cell in the "1, 0" state are set to ground potential (selection). One of the associated buried electrodes 18 is supplied with the high-level voltage $V_H$ and the other is supplied with a low-level voltage $V_L$ (ground potential) (of course, the high-level voltage is also allowed). Writing the cell to either the "0, 1" state or the "1, 0" state can be performed by changing the programming voltage (Vpp) and its application time.

TABLE 2

Four-valued data (buried type with 1 poly sidewall)

| | Bit. Con | Selected gate | Non-selected gate | Side-wall poly | Write mode |
|---|---|---|---|---|---|
| Selected cell | Ground | Vpp | Vpass | H, H | "1,1"→"0,0" |
| | | | | H, L | "1,1"→"1,0","0,1" |
| Non-selected cell | Vcc | Vpp | Vpass | H, H | "1,1"→"1,1" or |
| | | | | H, L | write is nonselected |

H: $V_H$ (3 to 10 V)
L: $V_L$ (Ground)

In reading/erasing data, the buried electrode 18 is set to the low-level voltage $V_L$ taking into account potential variations due to parasitic capacitance associated with the channel region of the adjacent cell. The others remain unchanged from the conventional device.

As described above, according to the present invention, in a rewritable EEPROM memory which has an STI structure and is written with two- or more-valued data through the use of the floating channel writing technique, controlling a voltage applied to the sidewall poly electrode buried in a trench allows variations in the threshold of a memory cell which is connected to the selected word line and is to be written with a 1 to be reduced significantly. Thereby, such a write error as writes a 0 into the other cells can be prevented.

In addition, since the voltage applied to nonselected word lines at write time can be lowered, variations in the threshold of memory cells connected to the nonselected word lines can be reduced, which likewise prevents write errors.

In particular, since the sidewall oxide and the sidewall $CVD-SiO_2$ film are very small in thickness, the cells can be operated easily from a low voltage. This improves the coupling characteristic of the booster poly (buried electrode) with the cell. As a result, the write speed can be improved and the NAND pattern size can be shrank easily.

The first embodiment of the present invention has been described as the buried electrode being formed to reach the middle of the sidewall of the floating gate electrode (i.e., with 1 poly sidewall). This is not restrictive. For example, as shown in FIG. 14, the buried electrode 18 may be formed not to protrude from the surface of the Si substrate 11 (i.e., without 1 poly sidewall). That is, the ONO film 20 and the control gate electrode 21 are formed to reach the middle of the sidewall of the floating gate electrode 13 so that the buried electrode 19 will serve as only a boot electrode for the Si substrate 11. This provides an improved memory characteristic, which is the feature of a second embodiment of the present invention.

Second Embodiment

Figure 14A:
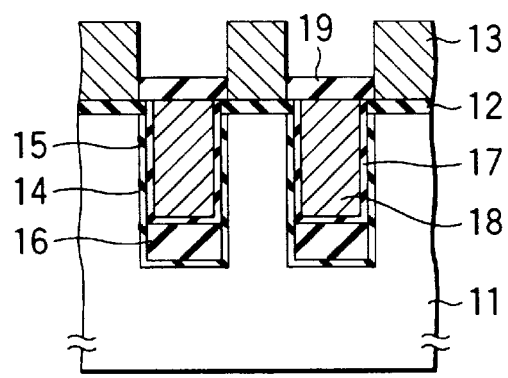
FIGS. 14A and 14B are sectional views of an EEPROM memory according to a second embodiment of the present invention.
Figure 14B:
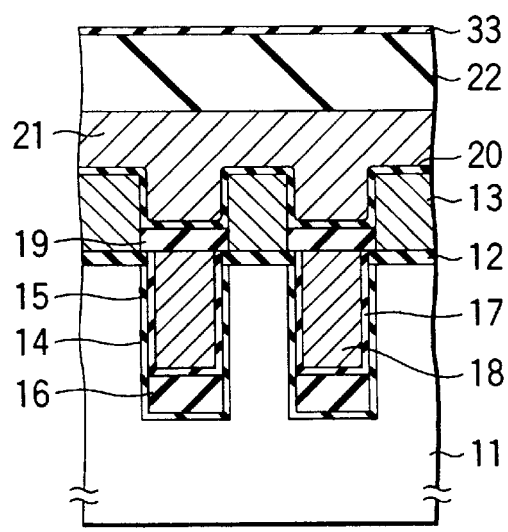

With the cell according to the second embodiment, in the step of FIG. 6G in the first embodiment, the polysilicon layer 18' is etched back until the surface of the Si substrate 11 is reached and then a $CVD-SiO_2$ film 19 is formed as shown in FIG. 14A. At this point, it is essential to etch back the $CVD-SiO_2$ film 19 until a desired coupling characteristic is obtained. After that, the same processes as the steps following the step shown in FIG. 6I are performed as shown in FIG. 14B.

Even if the buried electrode 18 is formed not to reach the middle of the sidewall of the floating gate electrode 13, it is supplied with the high-level voltage $V_H$ as described above, which will improve the write speed.

Figure 15A:
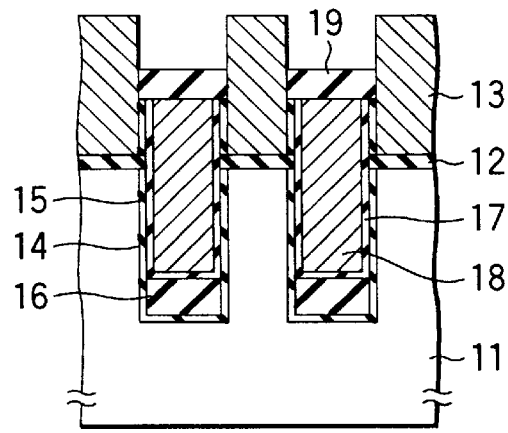
FIGS. 15A and 15B are sectional views of an EEPROM memory according to a third embodiment of the present invention.
Figure 15B:
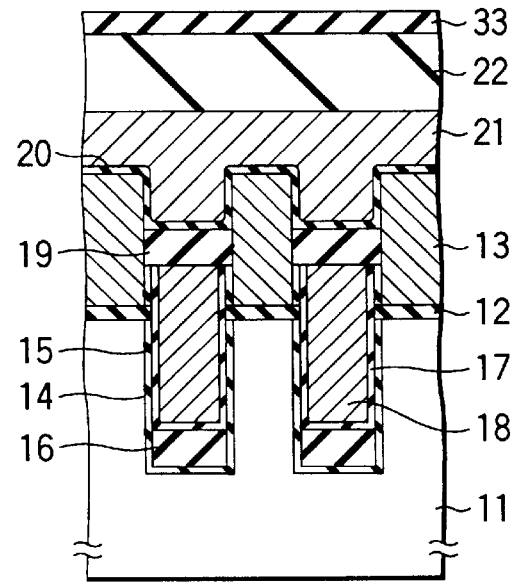

In addition, as shown in FIGS. 15A and 15B, it is also possible to use the buried electrode 18 as a boot electrode of each of the Si substrate 11 and the floating gate electrode 13 and form the ONO film 20 and the control electrode 21 to reach the middle of the sidewall of the floating gate electrode 13.

Third Embodiment

In the cells according to the third embodiment of the present invention, the 1 poly layer 13' used to form the floating gate electrode 13 is deposited at a thickness of, for example, about 4,000 angstroms in the step shown in FIG. 6B in the first embodiment. In the step shown in FIG. 6G, the polysilicon 18' is etched back until its top reaches the middle of the sidewall of the floating gate electrode 13 so as to obtain desired cell characteristics. After that, as shown in FIG. 15A the $CVD-SiO_2$ film 19 is etched back so that a desired coupling characteristic is obtained. After the upper sidewall of the floating gate electrode 13 has been exposed, the same processes as the steps following step of FIG. 6I are performed as shown in FIG. 15B.

Instead of substantially filling in the trench 14 with a conductive material (buried type) as in the previously described embodiments, the buried electrode 18 may be formed only along the sidewall of the trench (sidewall type) as in a fourth embodiment of the present invention which will be described below with reference to FIGS. 16A through 16I.

Fourth Embodiment

Figure 16A:
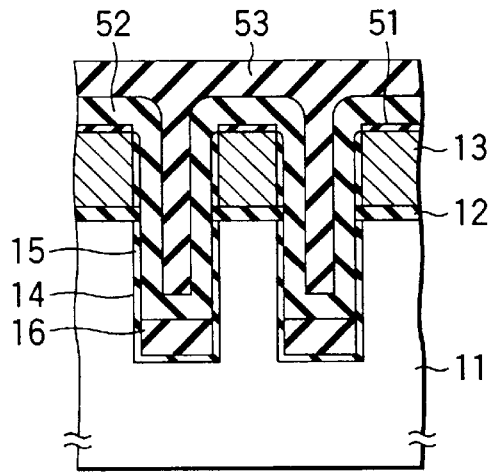
FIGS. 16A through 16I are sectional views, in the order of steps of manufacture, of an EEPROM memory according to a fourth embodiment of the present invention.

In the cells according to the fourth embodiment of the present invention, after the steps have been carried out through the FIG. 6E step as described in the first embodiment, a thermal oxide 51 is formed at a thickness of, for example, about 50 angstroms on top of the floating gate electrode 13. A sidewall SiN film 52 is then deposited at a thickness of, for example, about 1,000 angstroms. Subsequently, a $CVD-SiO_2$ film 53 is deposited at a thickness of, for example, about 2,000 angstroms as shown in FIG. 16A.

Figure 16D:
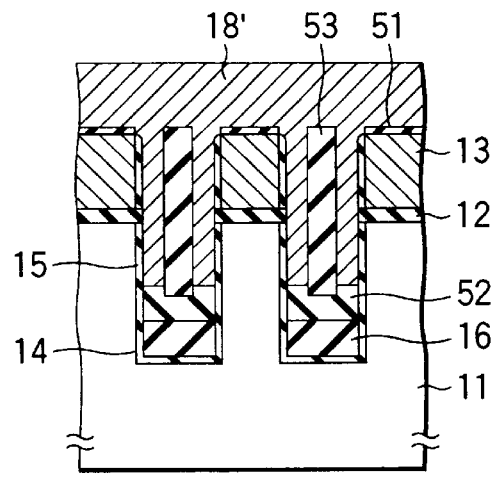
Figure 16B:
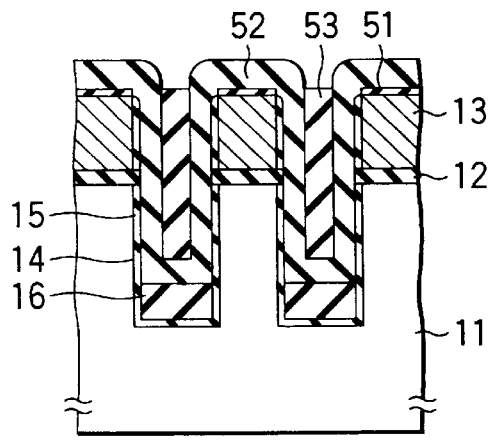
Figure 16E:
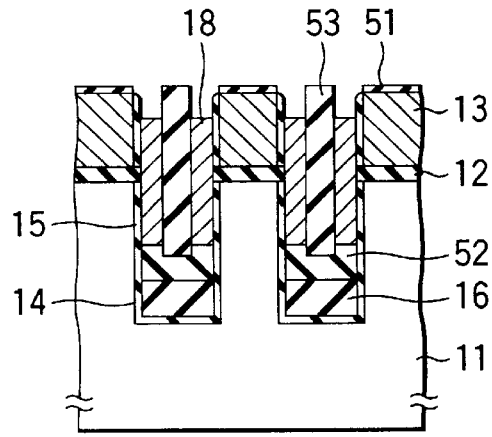
Figure 16C:
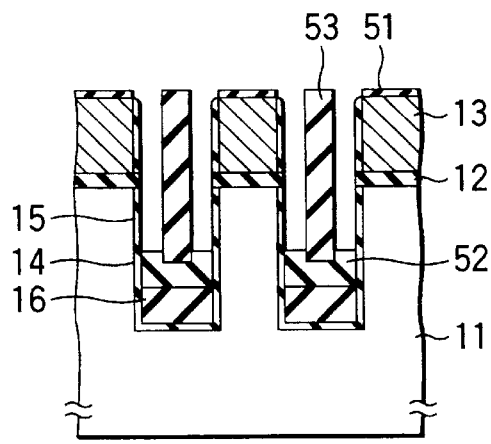

The $CVD-SiO_2$ film 53 is next etched back to expose the top of the sidewall SiN film 52 as shown in FIG. 16B. The sidewall SiN film 52 is then etched back using high-selectivity reactive ion etching techniques so as to leave the $CVD-SiO_2$ film 53 at the center and the sidewall SiN film 52 at the bottom of the trench 14 as shown in FIG. 16C.

Next, polysilicon 18', serving as the buried electrode 18, is deposited at a thickness of, for example, about 2,000 angstroms as shown in FIG. 16D. After that, the polysilicon 18' is etched back so that its top reaches the middle of the sidewall of the floating gate electrode 13. In this manner, the buried electrode 18 is formed along the sidewall of the trench with the sidewall of the buried electrode left as shown in FIG. 16E.

Figure 16F:
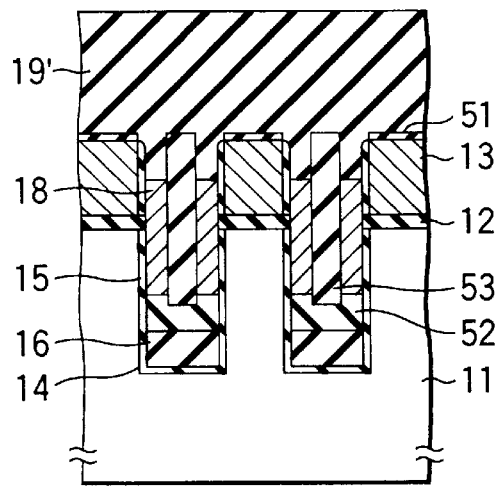
Figure 16G:
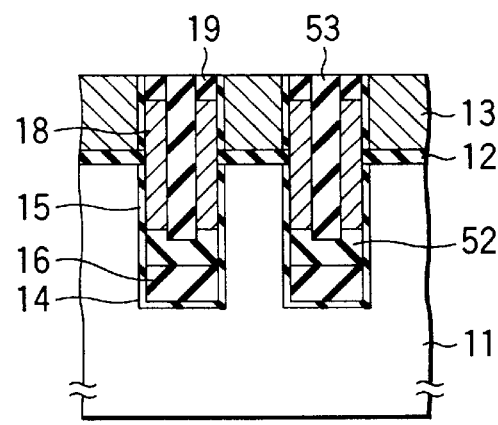
Figure 16H:
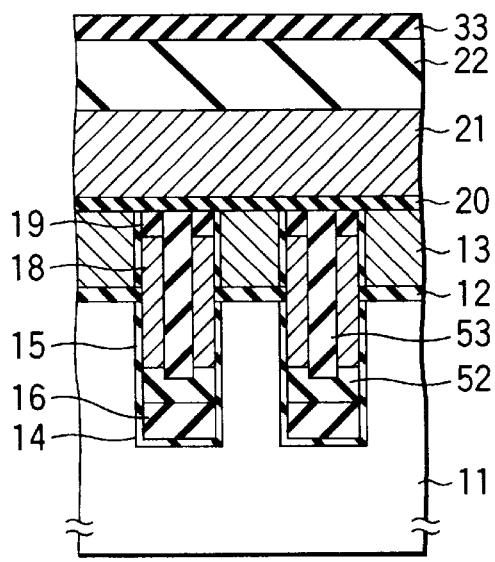
Figure 16I:
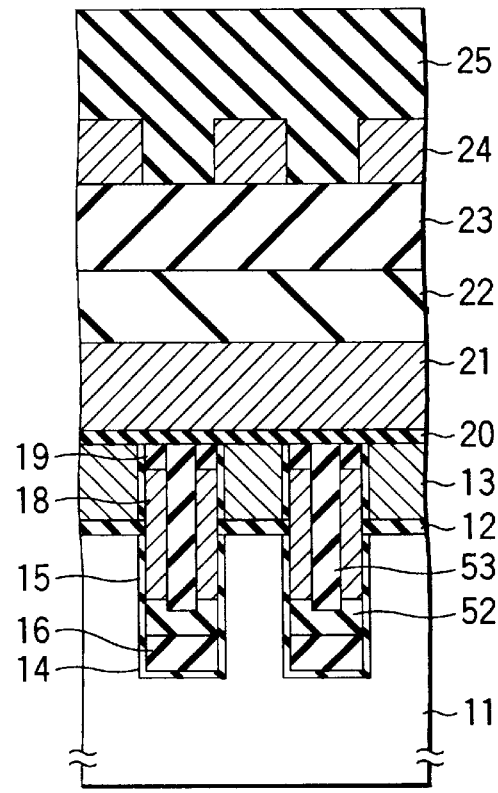

Next, a CVD-SiO$_2$ film 19' is deposited over the entire surface as shown in FIG. 16F. The film is then etched back using high-selectivity RIE techniques to form CVD-SiO$_2$ film 19 and the thermal oxide 51 is etched away to expose the top of the floating gate electrode 13 as shown in FIG. 16G. After that, the same processes as the steps following the FIG. 6I step are carried out as shown in FIGS. 16H and 16I.

Figure 17:
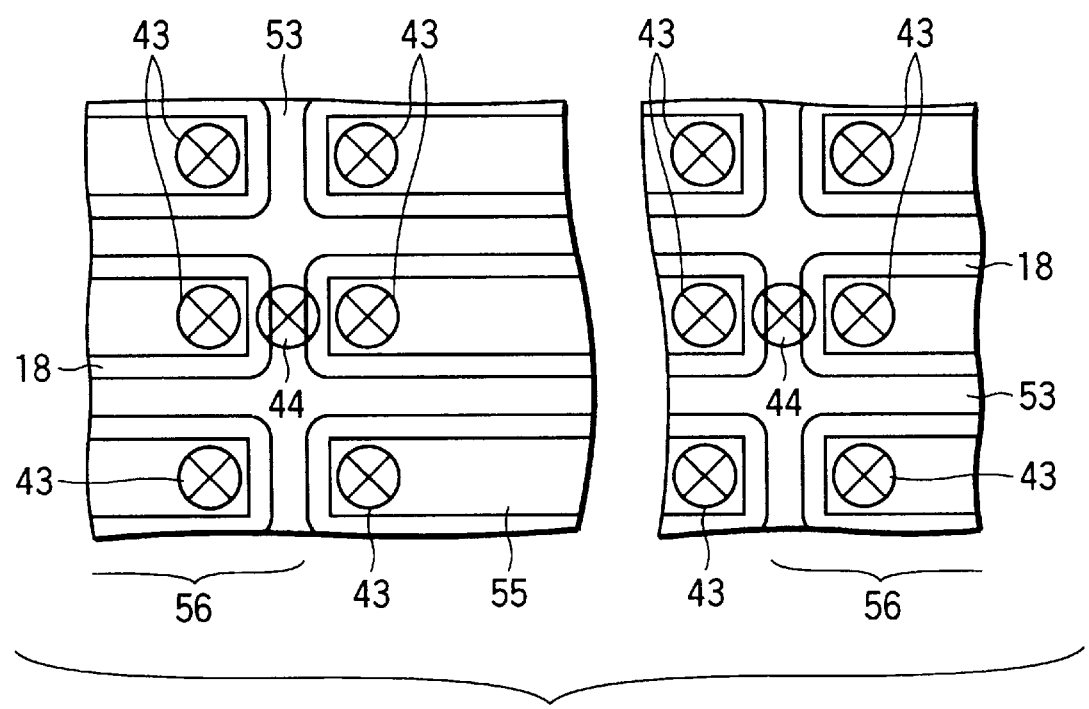
FIG. 17 is a plan view illustrating a way of contact in the EEPROM memory according to the fourth embodiment.

In the case of the cells of the fourth embodiment, contact to the buried electrode 18 (sidewall poly contact 44) is taken at cell pattern end 56 adjacent to the channel region 55 for each group of a predetermined number of blocks as shown in FIG. 17.

Such a cell arrangement makes it possible to apply a voltage separately to each of the buried electrodes 18 formed to correspond to the respective bit lines.

Figure 18A:
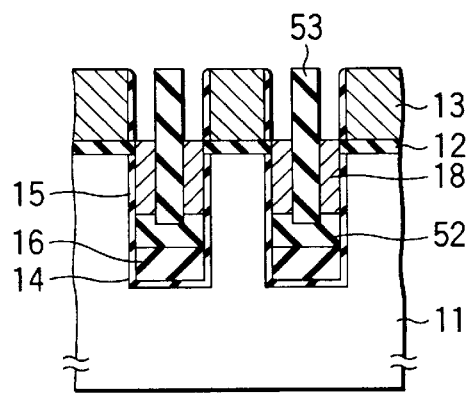
FIGS. 18A, 18B and 18C are sectional views of an EEPROM according to a fifth embodiment of the present invention.
Figure 18B:
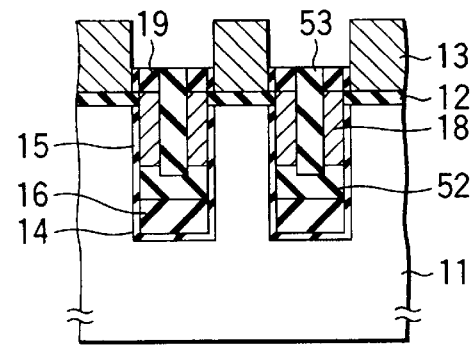
Figure 18C:
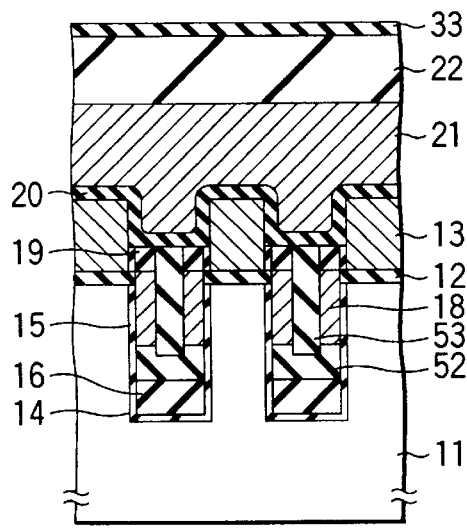

In the cells in which the buried electrode 18 is formed only along the sidewall of the trench 14 with its sidewall left, as in the cells of the second embodiment, the buried electrode can be formed so that its top will not protrude from the surface of the Si substrate 11 as shown in FIGS. 18A to 18C.

Fifth Embodiment

In the cells of the fifth embodiment of the present invention, the etchback of the polysilicon layer 18' in the FIG. 16E step in the fourth embodiment is stopped at the level of the surface of the Si substrate as shown in FIG. 18A and then the FIGS. 16F and 16G steps are carried out to form the CVD-SiO$_2$ film 19 as shown in FIG. 18B. At this point, it is essential to each back the film 19 together with the CVD-SiO$_2$ film 53 until a desired coupling characteristic is obtained. After that, the same processes as the steps following the FIG. 16G are carried out as shown in FIG. 18C.

Figure 19A:
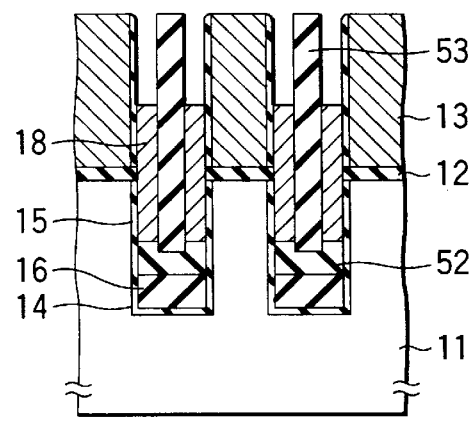
FIGS. 19A 19B and 19C are sectional views of an EEPROM according to a sixth embodiment of the present invention.
Figure 19B:
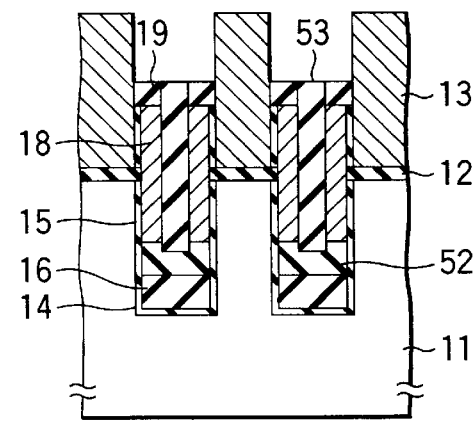
Figure 19C:
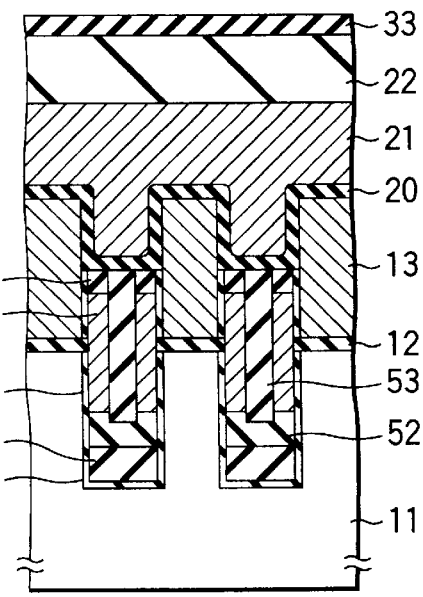

In addition, it is also possible to, as shown in FIGS. 19A to 19C, use the buried electrode 18 formed only along the sidewall of the trench 14 as a boot electrode of each of the Si substrate 11 and the floating gate electrode 13 and to form the ONO film 20 and the control electrode 21 to reach the middle of the sidewall of the floating gate electrode 13.

Sixth Embodiment

In the cells according to the sixth embodiment of the present invention, in the FIG. 6B step in the first embodiment, the 1 poly layer 13', serving as the floating gate electrode, is deposited at a thickness of, for example, about 4,000 angstroms. In the FIG. 16E step, the polysilicon 18' layer is etched back so that its top reaches the middle of the sidewall of the floating gate electrode 13 as shown in FIG. 19A, thereby obtaining desired cell characteristics. After that, as shown in FIG. 19B, CVD-SiO$_2$ film 19 is buried and then etched back together with the CVD-SiO$_2$ film 53 so as to obtain a desired coupling characteristic. After the upper sidewall of the floating gate electrode 13 is exposed, the same processes as the steps following the FIG. 16G step are carried out as shown in FIG. 19C.

Figure 20:
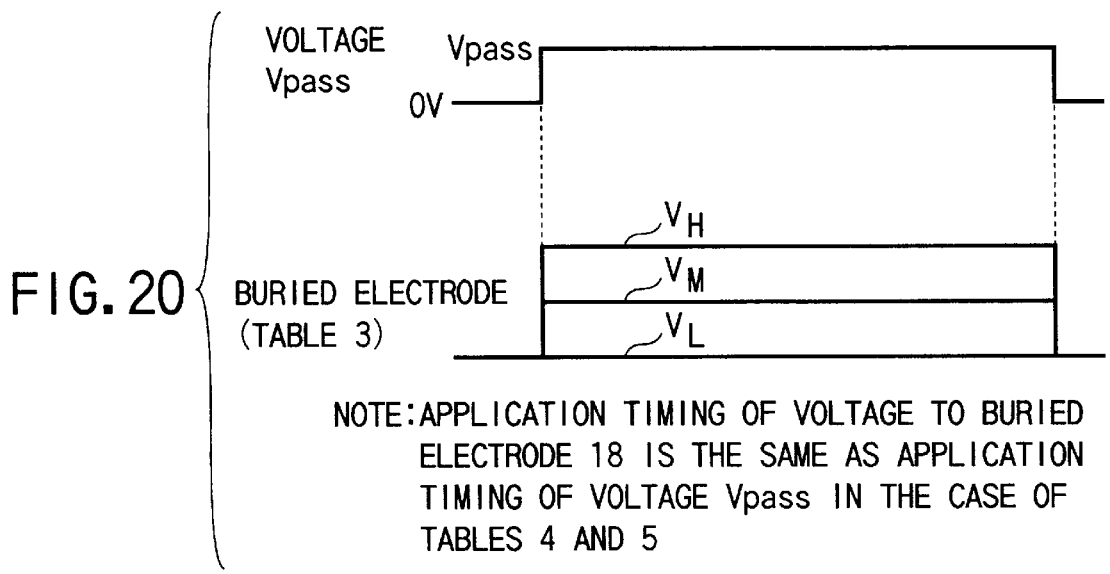
FIG. 20 is a timing diagram illustrating the timing of application of voltages to main electrodes at the time of writing of data in the fourth, fifth and sixth embodiments.

FIG. 20 shows the timing of applying of voltages to the main electrodes at programming time in the cell in which the buried electrode 18 is formed with the sidewall left. The voltages are desired voltages. The voltages in the cell section at times other than the programming time remain unchanged from those in the conventional device and their descriptions are omitted here.

In writing four-valued data into the cells of the fourth and sixth embodiments (refer to Table 3), since the buried electrode 18 is formed so that its top reaches the middle of the sidewall of the floating gate electrode 13, the floating gate electrode voltage is raised by the voltage at the buried electrode as well. As such, switching the voltage to the buried electrode among $V_H$, $V_M$, $V_L$ allows the "0, 0", "0, 1" and "1, 0" states to be written into properly.

TABLE 3

Four-valued data (sidewall type with 1 poly sidewall)

|  | Bit. Con | Selected gate | Nonselected gate | Sidewall poly | Write mode |
| --- | --- | --- | --- | --- | --- |
| Selected cell | Ground | Vpp | Vpass | H | "1,1"→"0,0" |
|  | Ground | Vpp | Vpass | M | "1,1"→"0,1" |
|  | Ground | Vpp | Vpass | L | "1,1"→"1,0" |
| Nonselected cell | Vcc | Vpp | Vpass | H | "1,1"→"1,1" |

L: $V_L$ (Ground)
M: $V_M$ (3 to 5 V)
H: $V_H$ (5 to 10 V)

In writing four-valued data into the cells of the fifth embodiment (see Table 3), the floating gate electrode voltage is not raised. In writing the cell to the "0, 0" state, therefore, the bit line contact 42 and the buried electrode 18 are set to ground potential so as to maximize the voltage across the tunnel oxide 12.

In writing the cell to either the "0, 1" or "1, 0" state, the potential at the channel region 55 is controlled by the voltage at the buried electrode 18 with the supply voltage Vcc applied to the bit line contact 42 and the cell region 41 maintained floating. That is, a desired voltage is applied to the buried electrode 18 to control the potential at the channel region 55. Thereby, the voltage across the tunnel oxide 12 is controlled to change the write characteristic. In this manner, the cell can be written to either the "0, 1" or "1, 0" state properly.

TABLE 4

Four-valued data (sidewall type without 1 poly sidewall)

|  | Bit. Con | Selected gate | Nonselected gate | Sidewall poly | Write mode |
| --- | --- | --- | --- | --- | --- |
| Selected cell | Ground | Vpp | Vpass | H | "1,1"→"0,0" |
|  | Vcc | Vpp | Vpass | M$_1$ | →"0,1" |
|  | Vcc | Vpp | Vpass | M$_2$ | →"1,0" |
| Nonselected cell | Vcc | Vpp | Vpass | H | →"1,1" |

L: $V_L$ (Ground)
M$_1$: $V_{M1}$ (≈3 V)
M$_2$: $V_{M2}$ (≈5 V)
H: $V_H$ (5 to 10 V)

In writing two-valued data into the cells of the fourth, fifth and sixth embodiments (see Table 5), the nonselected cell has its associated buried electrode 18 impressed with the high-level (H) voltage $V_H$ to thereby raise the potential of the channel region 55 of a desired cell, thereby preventing erroneous writing. In the selected cell, since its channel region is at ground potential, the voltage level of the buried electrode may be set high (H) or low (L). When the buried electrode is formed to reach the middle of the sidewall of the floating gate electrode, it is advisable that the potential at the buried electrode 18 be high because an improvement in the write characteristic is expected.

TABLE 5

Two-valued data (sidewall type with and without 1 poly sidewall)

| | Bit. Con | Selected gate | Nonselected gate | Sidewall poly | Write mode |
|---|---|---|---|---|---|
| Selected cell | Ground | Vpp | Vpass | L or H | "1"→"0" |
| Nonselected cell | Vcc | Vpp | Vpass | H | "1"→"1" |

L: $V_L$ (Ground)
H: $V_H$ (5 to 10 V)

In data readout/erase, as in the case of the cells of the first embodiment, the potential at the buried electrode 18 is set low taking into consideration potential variations due to parasitic capacitance associated with the adjacent cell channel region. The others remain unchanged from the conventional device.

Figure 21:
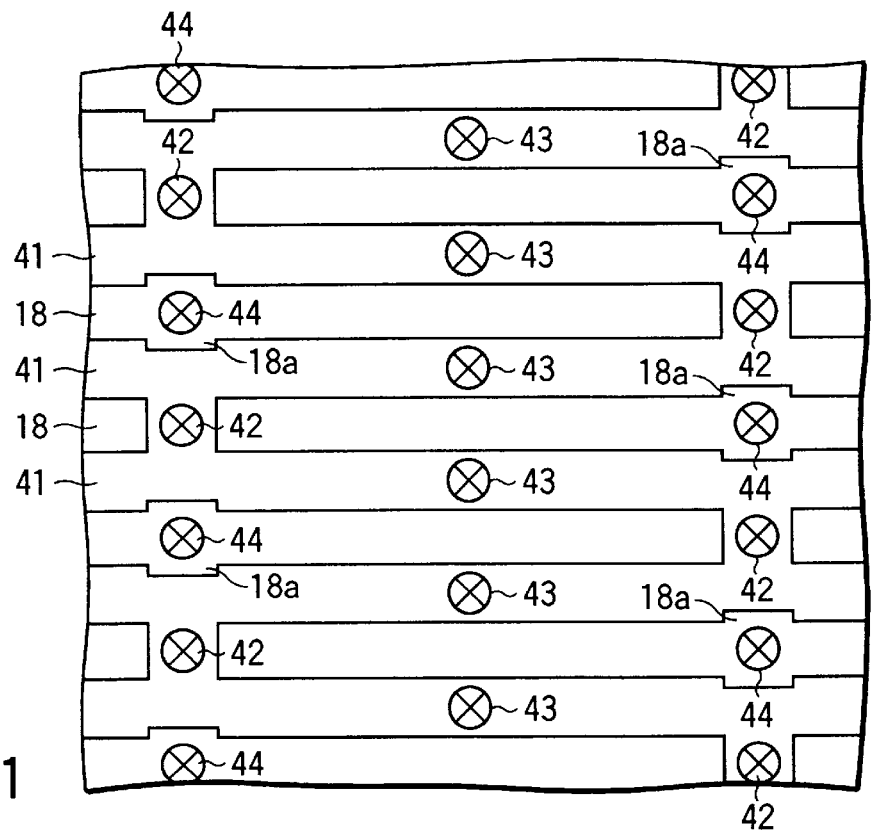
FIG. 21 is a plan view illustrating another layout of contact wirings in the cell section.

As for the formation of contact wirings, the buried electrode 18 may be provided with fringes 18a as shown in FIG. 21 so as to provide a margin for misalignment of the contact wirings in the row direction. In the column direction, on the other hand, there is no problem of misalignment because of SAC process.

Seventh Embodiment

Figure 22:
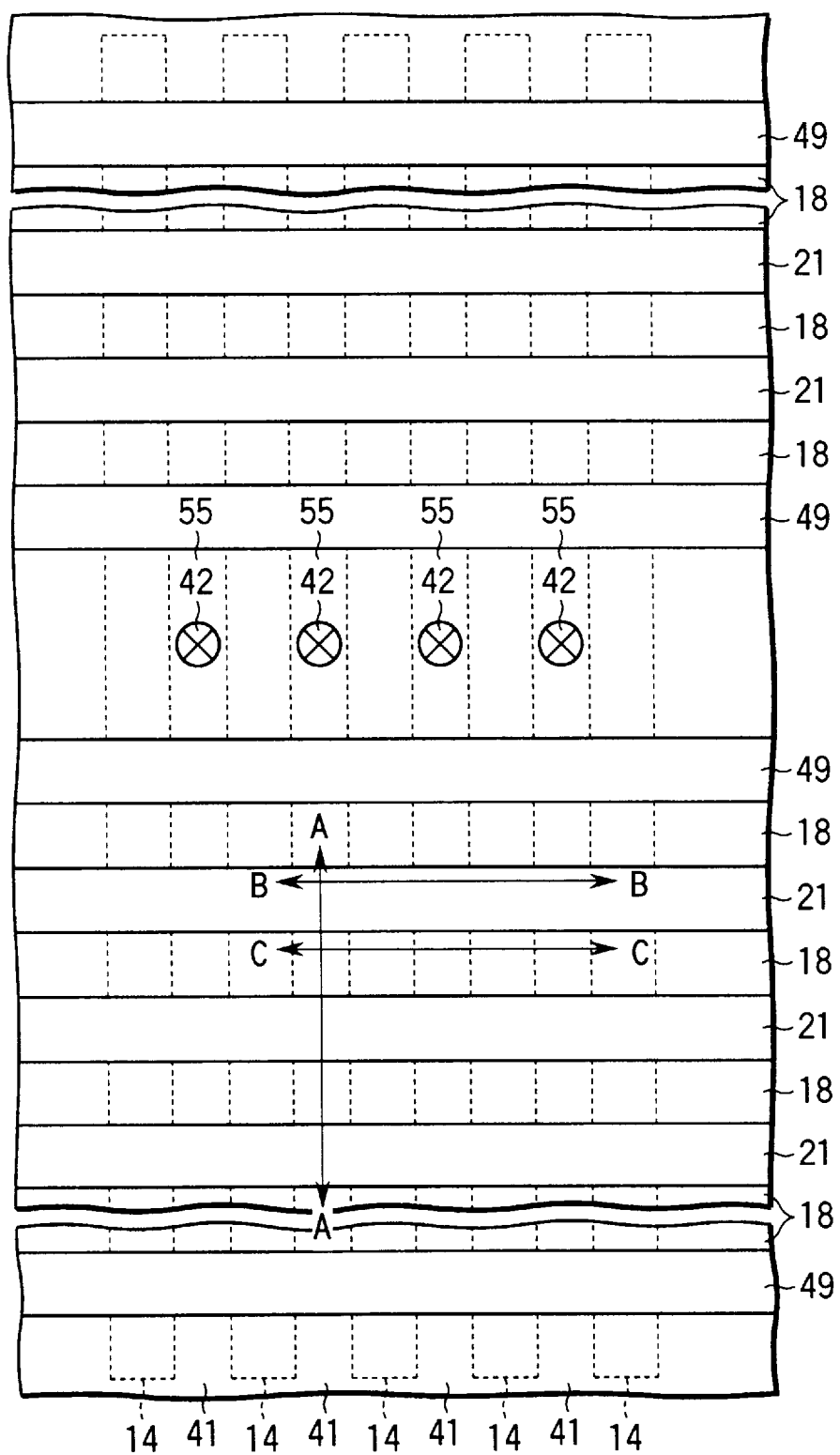
FIG. 22 is a plan view of the cell section of an EEPROM memory according to a seventh embodiment of the present invention.
Figure 23A:
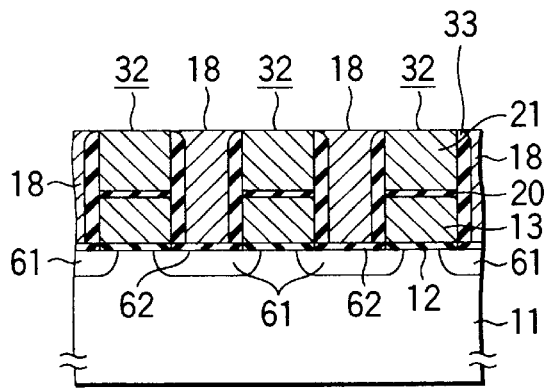
FIGS. 23A, 23B and 23C are sectional views of an EEPROM memory according to the seventh embodiment of the present invention.
Figure 23B:
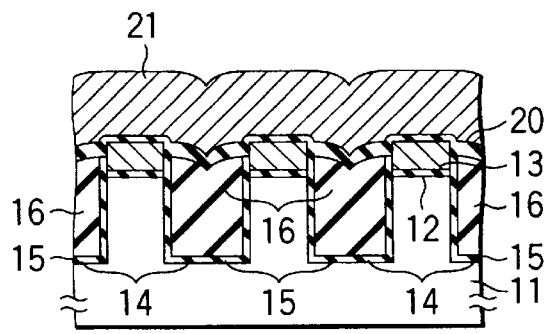
Figure 23C:
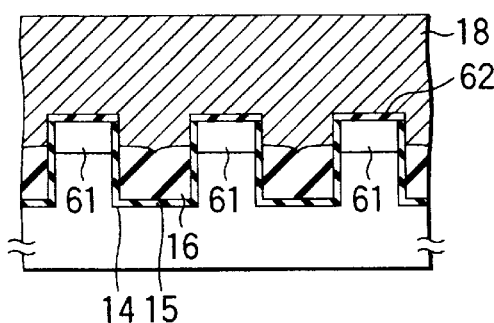

FIG. 22 and FIGS. 23A to 23C show an arrangement of the cell section of an EEPROM memory according to the seventh embodiment of the present invention which has an STI structure and is of the floating channel writing type. FIG. 22 is a plan view of the cell section. FIG. 23A is a sectional view taken along line A—A of FIG. 22, FIG. 23B is a sectional view taken along line B—B of FIG. 22, and FIG. 23C is a sectional view taken along line C—C of FIG. 22.

As shown in FIG. 22 and FIG. 23A, in each cell region 41, a plurality of floating gate electrodes 13, each serving as a charge storage layer, are selectively provided on tunnel oxide 12 formed on the surface of an Si substrate 11 (a well region of a second conductivity type formed in a semiconductor substrate of a first conductivity type or a well region of the first conductivity type formed in a semiconductor substrate of the second conductivity type). A control gate electrode (2 poly) 21 is formed above the corresponding floating gate electrode with ONO film (interlayer insulating film) 20 interposed therebetween, thus forming a gate electrode unit 32.

On the sidewall of the gate electrode unit 32 is formed a sidewall SiN film 33 for SAC. Source/drain diffused regions 61 are formed in selected portions of the surface of the Si substrate 11 which are located between each gate electrode unit 32. NAND cells, which are connected in series in such a way that adjacent memory cells share a source/drain diffused region located therebetween, are arranged in a matrix form to constitute a memory cell array.

Though not shown in FIG. 22 and FIGS. 23A to 23C, the drain diffused region 61 at one end of each cell region 41 is connected to a corresponding bit line extending in the column direction through one or more select gates 49. The control gate electrode 21 is continuously formed for all the corresponding cells arranged in a row, forming a word line.

The buried (sidewall poly) electrode 18 consisting of a conductive material (3 poly) is formed above portions of the surface of the Si substrate which are located above the source/drain diffused region 61 between each control gate unit 31 with a post oxide 62 therebetween.

For each word line, as shown in FIG. 22 and FIG. 23B, the floating gate electrodes 13 are formed above the selected portions of the surface of the Si substrate 11 with the tunnel oxide 12 therebetween. The trench 14 is formed in each of the selected portions of the major surface of the Si substrate 11 which is located between each floating gate electrode 13. In each trench is formed the buried CVD-$SiO_2$ film 16. The control gate electrode (2 poly) 21 is formed to run above the CVD-$SiO_2$ film 16 in each trench and each floating gate electrode 13 with the ONO film 20 interposed therebetween.

In between each word line, as shown in FIG. 22 and FIG. 23C, the source/drain diffused regions 61 are formed in the selected portions of the surface of the Si substrate 11. The trench 14 is formed in each of the selected portions of the major surface of the Si substrate 11 which is located between each source/drain diffused region 61. In each trench, the CVD-$SiO_2$ film (buried insulating film) 16 is buried with the sidewall oxide 15 therebetween. The buried electrode 18 is formed above the CVD-$SiO_2$ film 16 in each trench and each source/drain diffused region 61. The post oxide 62 is formed between the source/drain diffused region and the buried electrode. The buried electrode, which is used to raise the potential of the Si substrate 11, is buried in each trench at a predetermined depth.

In the channel region 55 between the select gates 49, each bit line contact 42 is taken in common to two NAND cells which are adjacent to each other in the column direction.

Though not shown in FIG. 22 and FIGS. 23A to 23C, the masking silicon nitride (SiN) film 22, the interlayer film 23 and the Al wirings 24 are formed over the control gate electrodes 21 and the buried electrodes 18, and the resulting structure is then coated on top with the passivation film 25.

Next, reference will be made to FIGS. 24A to 24C through FIGS. 31A to 31C to describe a method of manufacturing an EEPROM memory thus constructed. Of these figures, FIGS. 24A, 25A, 26A, 27A, 28A, 29A, 30A and 31A each correspond to a sectional view taken along line A—A of FIG. 22, FIGS. 24B, 25B, 26B, 27B, 28B, 29B, 30B and 31B each correspond to a sectional view taken along line B—B of FIG. 22, and FIGS. 24C, 25C, 26C, 27C, 28C, 29C, 30C and 31C each correspond to a sectional view taken along line C—C of FIG. 22.

Figure 24A:
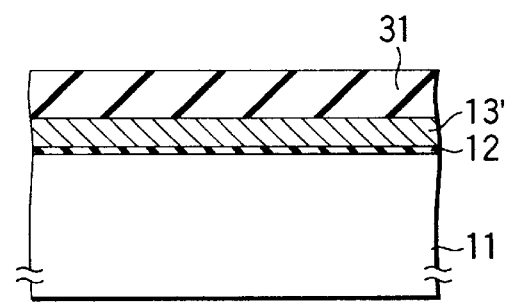
FIGS. 24A, 24B and 24C illustrate, in sectional view, a method of manufacturing the EEPROM memory of the seventh embodiment.
Figure 24B:
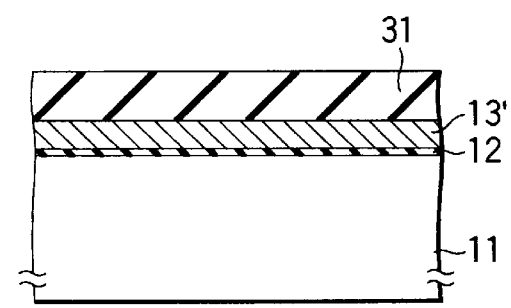
Figure 24C:
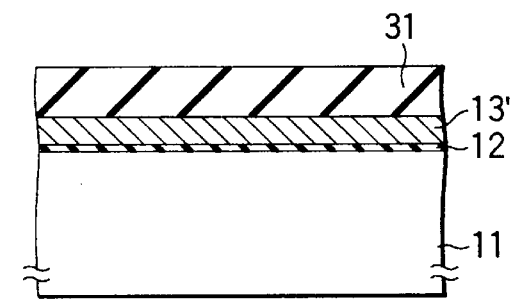
Figure 25A:
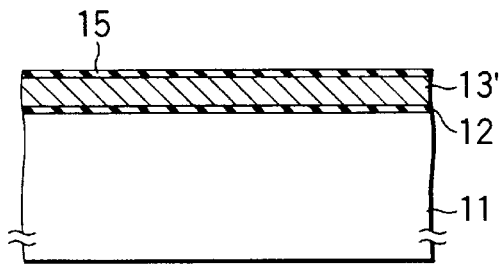
FIGS. 25A, 25B and 25C illustrate, in sectional view, a method of manufacturing the EEPROM memory of the seventh embodiment.

First, the tunnel oxide 12 is formed over the surface of the Si substrate 11, which is used for cell transistors, peripheral transistors and select gate transistors. The 1 poly layer 13' is deposited at a thickness of, for example, about 2,000 angstroms over the tunnel oxide 12, which are used to form the floating gate electrodes 13. Subsequently, the CVD-$SiO_2$ film 31, serving as a mask for forming the trenches, is deposited over the 1 poly layer at a thickness of, for example, about 3,000 angstroms as shown in FIGS. 24A, 24B, and 24C.

Figure 25B:
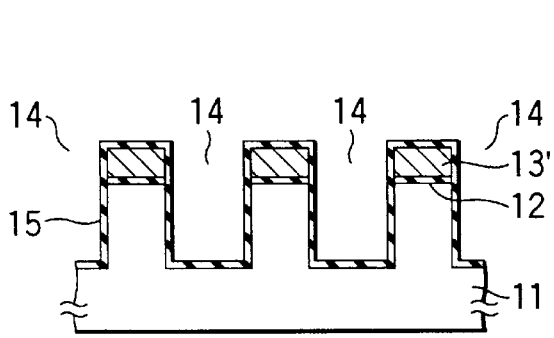
Figure 25C:
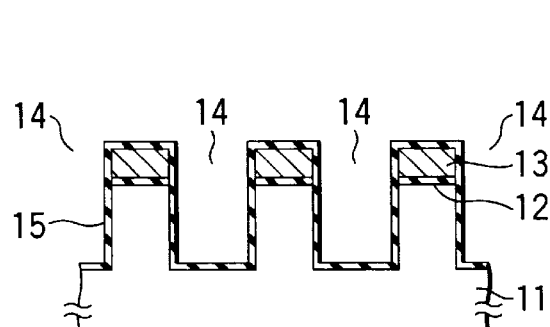

Next, the CVD-$SiO_2$ film 31 is patterned and then reactive ion etching is carried out using the patterned CVD-$SiO_2$ film as a mask to form the trenches 14 of a desired depth of about 0.4 μm from the surface of the Si substrate in portions of the surface of the Si substrate which are located between each word line. After the CVD-$SiO_2$ film 31 has been etched away (FIG. 25A), the sidewall oxide 15 is deposited over the entire surface at a thickness of, for example, about 100 angstroms by means of thermal oxide growth techniques as shown in FIGS. 25B and 25C.

Figure 26A:
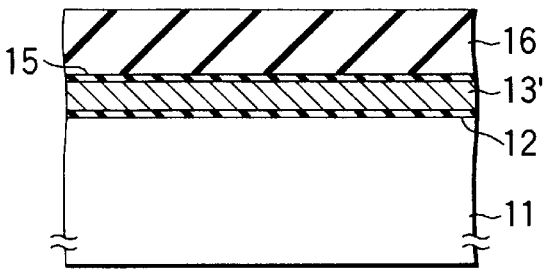
FIGS. 26A, 26B and 26C illustrate, in sectional view, a method of manufacturing the EEPROM memory of the seventh embodiment.
Figure 26B:
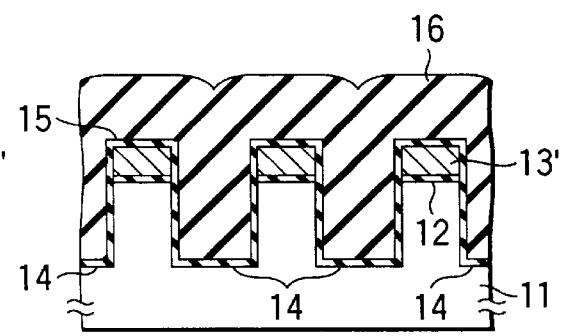
Figure 26C:
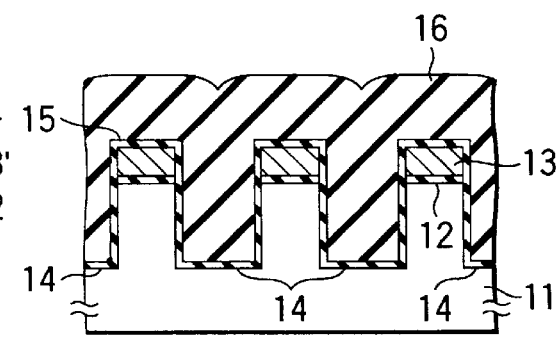

Next, the buried CVD-$SiO_2$ film 16 is deposited over the entire surface to completely fill in the trenches 14 coated with the sidewall oxide 15 as shown in FIGS. 26A, 26B and 26C.

Figure 27A:
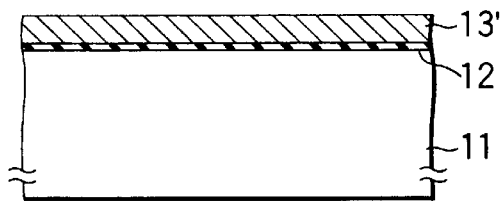
FIGS. 27A, 27B and 27C illustrate, in sectional view, a method of manufacturing the EEPROM memory of the seventh embodiment.
Figure 27B:
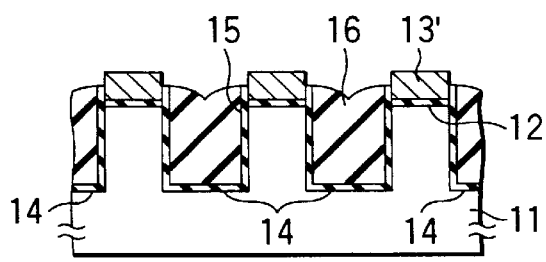
Figure 27C:
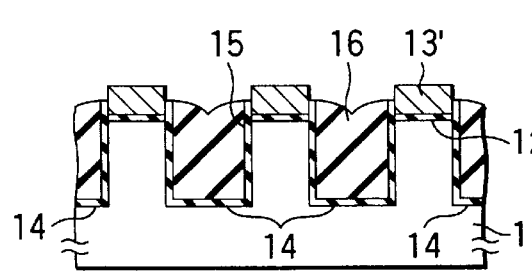

Next, the CVD-SiO$_2$ film 16 is etched back to expose the upper sidewall of the 1 poly 13' and the sidewall oxide 15 left on the top of the 1 poly 13' is removed. After that, the sidewall oxide 15 left on the sidewall of the 1 poly layer 13' is removed using, for instance, an ammonium fluoride liquid as shown in FIGS. 27A, 27B and 27C.

Figure 28A:
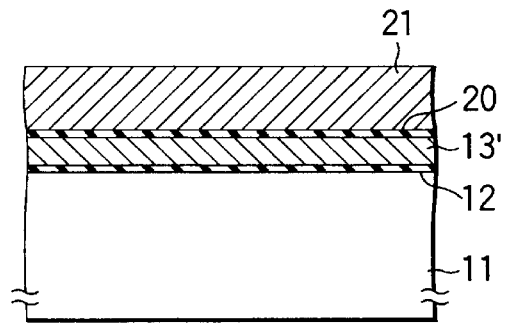
FIGS. 28A 28B and 28C illustrate, in sectional view, a method of manufacturing the EEPROM memory of the seventh embodiment.
Figure 28B:
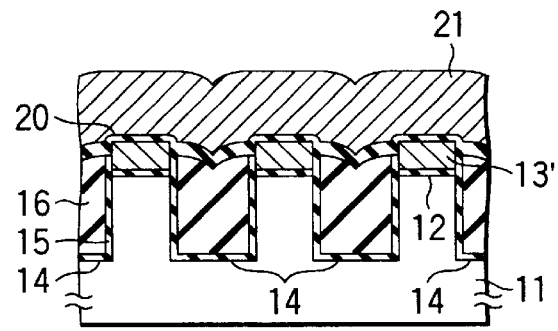
Figure 28C:
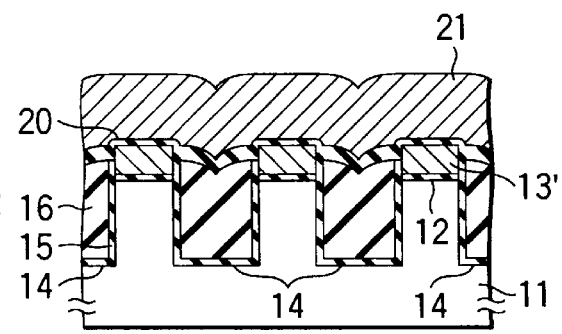

Next, ONO film 20 is formed over the entire surface and then a 2 poly layer, serving as control gate electrodes 21, is deposited over the entire surface at a thickness of, for example, about 2,000 angstroms as shown in FIGS. 28A, 28B and 28C.

Figure 29A:
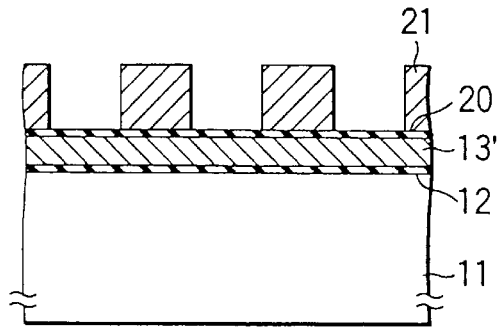
FIGS. 29A, 29B and 29C illustrate, in sectional view, a method of manufacturing the EEPROM memory of the seventh embodiment.
Figure 29B:
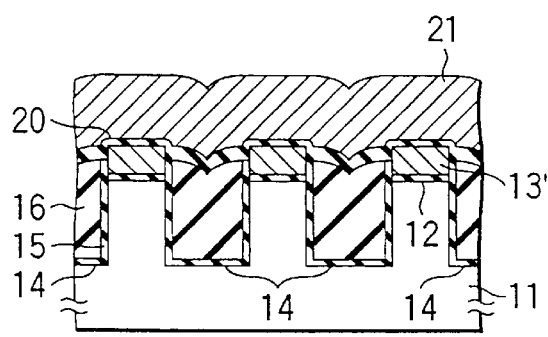
Figure 29C:
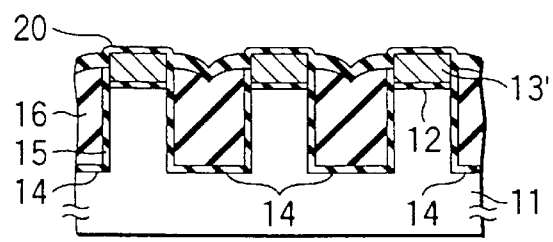

Next, the 2 poly layer is patterned to form control gate electrodes 21 serving as word lines as shown in FIGS. 29A and 29B.

Figure 30A:
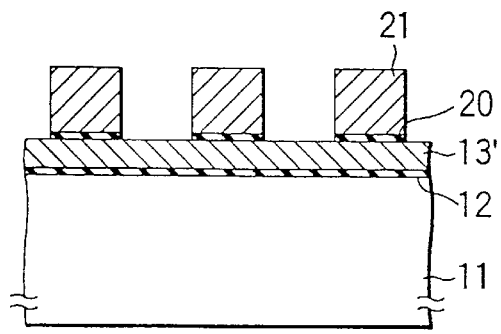
FIGS. 30A, 30B and 30C illustrate, in sectional view, a method of manufacturing the EEPROM memory of the seventh embodiment.
Figure 30B:
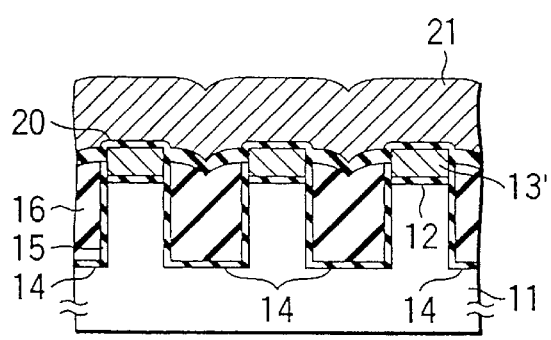
Figure 30C:
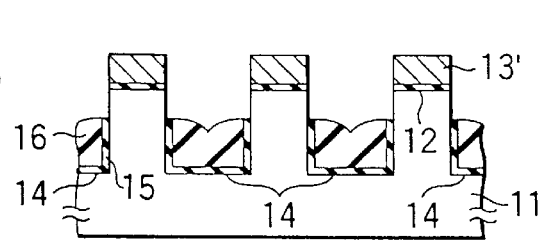

Next, the ONO film 20 exposed between each control gate electrode 21 is removed by means of RIE. At this point, an upper portion of the CVD-SiO$_2$ film 16 buried in the trench 14 is removed by the overetching process of RIE as shown in FIGS. 30A and 30C.

Figure 31A:
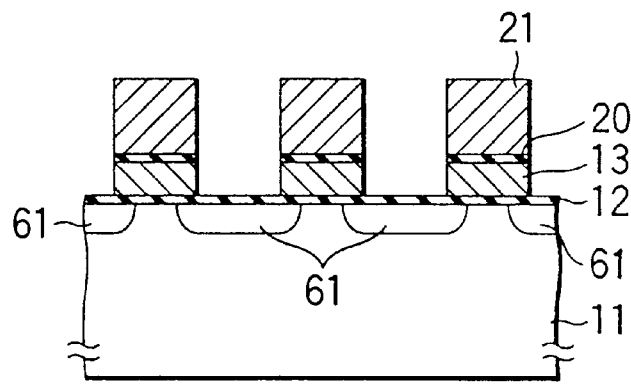
FIGS. 31A, 31B and 31C illustrate, in sectional view, a method of manufacturing the EEPROM memory of the seventh embodiment.
Figure 31B:
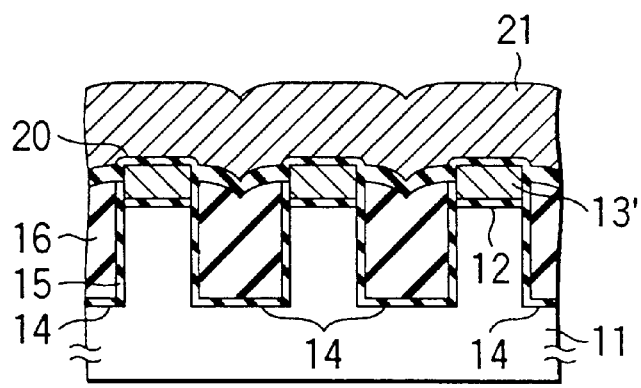
Figure 31C:
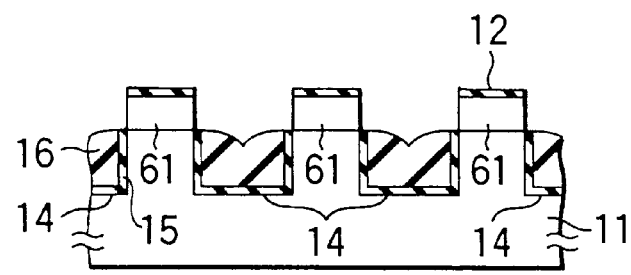

Next, the 1 poly layer 13' is patterned to form the floating gate electrodes 13. After that, impurities are ion-implanted into the surface of the Si substrate 11 to form source/drain diffused regions 61 as shown in FIGS. 31A and 31C.

Next, the tunnel oxide 12 exposed between each word line is etched away. Post oxide 62 is reformed on a portion corresponding to each source/drain diffused region 61 and then SAC sidewall SiN film 33 is formed. A conductive material is buried and then flattened. Buried (sidewall poly) electrode 18 is formed between each floating gate electrode 13 (control gate electrode 21). Thereby, the EEPROM cells constructed as shown in FIG. 22 and FIGS. 23A to 23C are produced.

After that, Al wirings 24 and so on are formed as in the first through sixth embodiments described above, thereby completing the EEPROM cells.

The buried electrodes 18 need not be patterned so that it is located between each floating gate electrode 13 (control gate electrode 21) as shown in FIG. 22. For example, the buried electrode may be patterned so that it is associated with each block in the memory cell array.

Such a structure as described above allows the rewriting of two- or four-valued data through transfer of charges between the floating gate electrode and the Si substrate by applying a write voltage to the control gate electrode and applying a low voltage to the buried electrode to thereby control the cell channel potential.

Moreover, by lowering the top of the CVD-SiO$_2$ film 16 buried in the trench 14 down to the portion in the Si substrate 11 where the source/drain diffused region 61 is formed, the area that the buried electrode 18 faces the Si substrate 11 can be increased. As a result, the boot ratio can be improved to further decrease the voltage applied to the buried electrode 18. Accordingly, the area of the peripheral circuitry (the charge-pump circuit, row/column decoders and so on) can be decreased and reliability can be increased.

Although the preferred embodiments have been disclosed and described, it is apparent that other embodiments and modifications are possible.

As described above, according to the present invention, the channel potential of write nonselected memory cells can be booted sufficiently by applying a low voltage to the buried electrodes in the trenches. This permits the suppression of variations in the threshold of a memory cell which is connected to a selected word line and into which a 1 is to be written without increasing the chip size. Therefore, a nonvolatile semiconductor memory device can be provided which permits the degradation of the write characteristic to be prevented and the write speed to be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A nonvolatile semiconductor memory device comprising:

a semiconductor substrate having a major surface;

a buried electrode formed by burying a conductive material in a plurality of trenches formed in the major surface of the semiconductor substrate with an insulating material interposed therebetween;

a plurality of floating gate electrodes formed above other portions of the semiconductor substrate than the portions where the buried electrode is formed with a tunnel insulating film interposed therebetween, the transfer of charges being made between the floating gate electrodes and the semiconductor substrate through the tunnel insulating film; and a control gate electrode formed above the floating gate electrodes with an inter-gate insulating film interposed therebetween.

2. The memory device according to claim 1, wherein the buried electrode is formed at least along the sidewalls of the trenches.

3. The memory device according to claim 1, wherein the buried electrode is formed in the trenches so that an upper surface thereof is substantially at the same level as the major surface of the semiconductor substrate.

4. The memory device according to claim 1, wherein the buried electrode is formed in the trenches so that it protrudes from the major surface of the semiconductor substrate.

5. The memory device according to claim 1, wherein the buried electrode is formed substantially perpendicular to the control gate electrode.

6. A nonvolatile semiconductor memory device comprising:

a semiconductor substrate having a major surface;

a plurality of floating gate electrodes formed above the surface of the semiconductor substrate with a tunnel insulating film interposed therebetween, the transfer of charges being made between the floating gate electrodes and the semiconductor substrate through the tunnel insulating film;

a plurality of buried electrodes each formed by burying a conductive material in a corresponding respective one of a plurality of trenches formed in the major surface of the semiconductor substrate each of which is located between the floating gate electrodes; and a control gate electrode formed above the buried electrodes and the floating gate electrodes with an inter-gate insulating film interposed therebetween.

7. The memory device according to claim 6, wherein each of the buried electrodes is formed at least along the sidewall of the corresponding respective trench.

8. The memory device according to claim 6, wherein the trenches are provided among the floating gate electrodes and self-aligned with the floating gate electrodes.

9. The memory device according to claim 6, further comprising:
a memory cell array having a plurality of memory cell transistors arranged in a matrix form, each memory cell transistor of a stacked structure having one floating gate electrode and one control gate electrode;
bit lines each of which is connected in common to two or more memory cell transistors arranged in the same column of the memory cell array; and
word lines each of which is connected in common to two or more memory cell transistors arranged in the same row of the memory cell array, and wherein
the buried electrodes are formed along the bit lines.

10. The memory device according to claim 9, wherein each of the buried electrodes is formed in the corresponding respective trench so that an upper surface thereof is substantially at the same level as the major surface of the semiconductor substrate.

11. The memory device according to claim 9, wherein each of the buried electrodes is formed in the corresponding respective trench so that it protrudes from the major surface of the semiconductor substrate.

12. The memory device according to claim 9, wherein the memory cell transistors are multi-bit data storable ones having at least an erase state and multiple write states, and, at the time of writing into each of the memory cell transistors, the corresponding buried electrode is supplied with a predetermined potential which is dependent on a write state to be written into the memory cell transistor.

13. The memory device according to claim 12, wherein each of the buried electrodes has a first part and a second part provided along a pair of symmetric sidewalls of the corresponding respective trench and electrically isolated from each other.

14. The memory device according to claim 10, wherein, the memory cell transistors are multi-bit data storable ones having at least an erase state and multiple write states, in writing a first write state into each of the memory cell transistors, the corresponding buried electrode is supplied with a first potential, and, in writing a second write state larger in threshold voltage than the first write state into each of the memory cell transistors, the corresponding buried electrode is supplied with a second potential lower than the first potential.

15. The memory device according to claim 11, wherein, the memory cell transistors are multi-bit data storable ones having at least an erase state multiple write states, in writing a first write state into each of the memory cell transistors, the corresponding buried electrode is supplied with a first potential, and, in writing a second write state larger in threshold voltage than the first write state into each of the memory cell transistors, the corresponding buried electrode is supplied with a second potential higher than the first potential.

16. A nonvolatile semiconductor memory device comprising:
a semiconductor substrate having a major surface;
a plurality of buried insulating films formed by burying an insulating material in a corresponding respective one of a plurality of trenches formed in selected portions of the major surface of the semiconductor substrate;
a plurality of floating gate electrodes formed above portions of the major surface of the semiconductor substrate each of which is located between the buried insulating films with a tunnel insulating film interposed therebetween, the transfer of charges being made between the floating gate electrodes and the semiconductor substrate through the tunnel insulating film;
a plurality of control gate electrodes each of which is formed above the floating gate electrode and arranged substantially perpendicular to the trenches with an inter-gate insulating film interposed therebetween; and
a buried electrode formed in portions of the trenches each of which is located between the control gate electrodes, the buried electrode being buried in the portions of the trenches above the insulating material.

17. The memory device according to claim 16, wherein the buried electrode is buried at a predetermined depth in the trenches.

18. The memory device according to claim 16, further comprising:
a memory cell array having a plurality of memory cell transistors arranged in a matrix form, each memory cell transistor having a stacked structure of the floating and control gate electrodes;
bit lines each of which is connected in common to two or more memory cell transistors arranged in the same column of the memory cell array; and
word lines each of which is connected in common to two or more memory cell transistors arranged in the same row of the memory cell array, and wherein
the buried electrode is formed at least along the word lines.

19. The memory device according to claim 18, wherein the buried electrode is buried among the memory cell transistors of stacked structures between the control gate electrodes.

20. The memory device according to claim 16, wherein the buried insulating films are element-isolating insulating films self-aligned with the floating gate electrodes.

* * * * *